United States Patent
Akiyama et al.

(10) Patent No.: US 12,019,374 B2
(45) Date of Patent: Jun. 25, 2024

(54) PHOTOSENSITIVE RESIN STRUCTURE FOR FLEXOGRAPHIC PRINTING PLATE AND METHOD FOR PRODUCING FLEXOGRAPHIC PRINTING PLATE

(71) Applicant: ASAHI KASEI KABUSHIKI KAISHA, Tokyo (JP)

(72) Inventors: Hiroki Akiyama, Tokyo (JP); Shinji Miyamoto, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/037,437

(22) PCT Filed: Dec. 14, 2021

(86) PCT No.: PCT/JP2021/046025
§ 371 (c)(1),
(2) Date: May 17, 2023

(87) PCT Pub. No.: WO2022/158172
PCT Pub. Date: Jul. 28, 2022

(65) Prior Publication Data
US 2024/0012328 A1 Jan. 11, 2024

(30) Foreign Application Priority Data

Jan. 20, 2021 (JP) .................... 2021-007103
Jan. 20, 2021 (JP) .................... 2021-007168

(51) Int. Cl.
*G03F 7/11* (2006.01)
*B41C 1/10* (2006.01)
(Continued)

(52) U.S. Cl.
CPC .............. *G03F 7/11* (2013.01); *B41C 1/10* (2013.01); *B41F 5/24* (2013.01); *C08F 10/10* (2013.01); *C08F 120/14* (2013.01)

(58) Field of Classification Search
CPC .......... C08F 120/14; C08F 10/10; B41F 5/24; B41C 1/10; G03F 7/11
See application file for complete search history.

(56) References Cited

U.S. PATENT DOCUMENTS 7,226,709 B1 6/2007 Kidnie et al.
2003/0180655 A1 9/2003 Fan et al.
(Continued)

FOREIGN PATENT DOCUMENTS

JP 8-305030 A 11/1996
JP 2916408 B2 7/1999
(Continued)

OTHER PUBLICATIONS

International Search Report and Written Opinion of the International Searching Authority issued in International Patent Application No. PCT/JP2021/046025, dated Feb. 15, 2022, along with an English translation thereof.
(Continued)

*Primary Examiner* — David H Banh
(74) *Attorney, Agent, or Firm* — GREENBLUM & BERNSTEIN, P.L.C.

(57) ABSTRACT

A photosensitive resin structure for a flexographic printing plate, including: a support (a); a photosensitive resin composition layer (b) laminated on the support (a); and an infrared ray ablation layer (c) laminated on the photosensitive resin composition layer (b), wherein the infrared ray ablation layer (c) contains a resin having a predetermined constituent unit (c1).

14 Claims, 1 Drawing Sheet

(51) Int. Cl.
  *B41F 5/24* (2006.01)
  *C08F 10/10* (2006.01)
  *C08F 120/14* (2006.01)

(56) References Cited

U.S. PATENT DOCUMENTS

| | | | |
|---|---|---|---|
| 2003/0211419 A1 | 11/2003 | Fan | |
| 2004/0241573 A1 | 12/2004 | Ray et al. | |
| 2009/0142876 A1* | 6/2009 | Tuan | C09K 11/06 252/586 |
| 2010/0086879 A1* | 4/2010 | Takayama | G03F 7/2041 524/553 |
| 2011/0236705 A1* | 9/2011 | Melamed | B05D 5/00 427/385.5 |
| 2013/0260121 A1 | 10/2013 | Inoue et al. | |
| 2015/0241770 A1 | 8/2015 | Yoshida et al. | |
| 2021/0229480 A1 | 7/2021 | Nakagawa | |
| 2022/0043352 A1 | 2/2022 | Fujiki et al. | |
| 2022/0082940 A1 | 3/2022 | Toyooka et al. | |

FOREIGN PATENT DOCUMENTS

| | | |
|---|---|---|
| JP | 2002-357907 A | 12/2002 |
| JP | 4080068 B2 | 4/2008 |
| JP | 2009-63873 A | 3/2009 |
| JP | 2009-119810 A | 6/2009 |
| JP | 2010-237583 A | 10/2010 |
| JP | 2012-137515 A | 7/2012 |
| JP | 2014-119594 A | 6/2014 |
| JP | 2015-11330 A | 1/2015 |
| JP | 2015-121652 A | 7/2015 |
| JP | 2016-188900 A | 11/2016 |
| WO | 2018/056211 A1 | 3/2018 |
| WO | 2020/122001 A1 | 6/2020 |
| WO | 2020/175422 A1 | 9/2020 |
| WO | 2020/209145 A1 | 10/2020 |

OTHER PUBLICATIONS

International Preliminary Report on Patentability issued in International Patent Application No. PCT/JP2021/046025, dated Jul. 20, 2023, along with an English translation thereof.

* cited by examiner

[Figure 1]
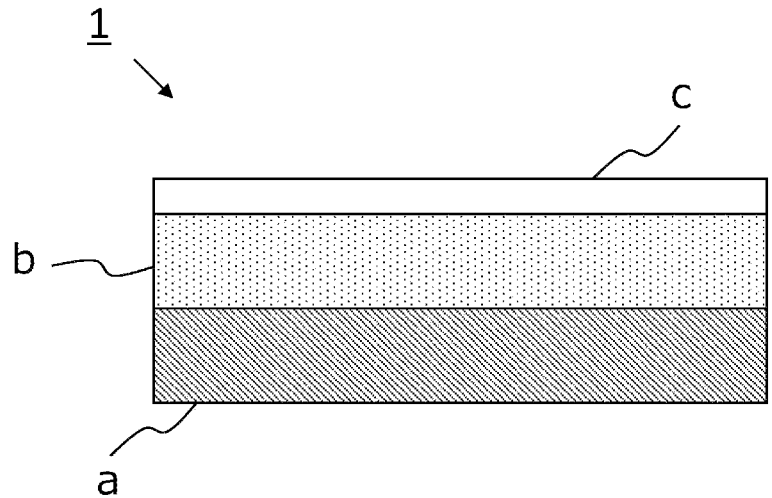
[Figure 2]
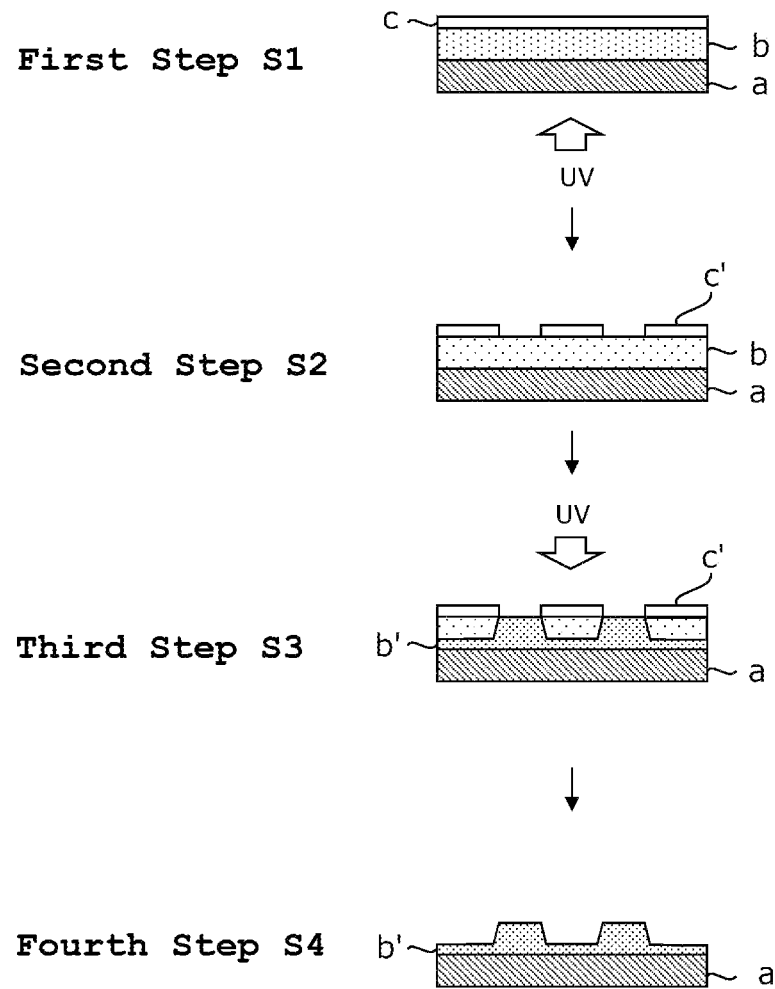

PHOTOSENSITIVE RESIN STRUCTURE FOR FLEXOGRAPHIC PRINTING PLATE AND METHOD FOR PRODUCING FLEXOGRAPHIC PRINTING PLATE

TECHNICAL FIELD

The present invention relates to a photosensitive resin structure for a flexographic printing plate and a method for producing a flexographic printing plate.

BACKGROUND ART

In recent years, further enhancement of definition of printed images has been required. Meanwhile, methods of directly drawing digital images with laser without the use of negative films by a computer to plate (CTP) technique have heretofore been widely used in the production process of flexographic printing plates.

In the CTP technique, a plate obtained by laminating a photosensitive resin composition layer, an infrared ray ablation layer ablatable with an infrared ray, and a cover film in order on a substrate such as a polyethylene terephthalate (PET) resin is generally used as an original plate for flexographic printing plate production.

The infrared ray ablation layer ablatable with an infrared ray generally contains an infrared ray absorber which is a material opaque to radiation other than infrared ray, and a resin.

Techniques of disposing microcells on the surface of printing plates have heretofore been known as techniques for achieving further enhancement of definition of printed images or improvement in ink transfer properties at the time of printing. Enhancement of resolution is also achieved in laser drawing apparatuses for use in the production process of flexographic printing plates, and the laser resolution has been enhanced from conventional laser resolution of 2540 DPI to 4000 DPI and further to 5080 DPI. Moreover, enhancement of resolution is expected to advance to 8000 DPI and the like.

For these reasons, the formation of smaller microcells further requires microfabrication by laser drawing for flexographic printing plates. Techniques for obtaining infrared ray ablation layers excellent in infrared laser drawing properties have been required therefor in the production process of flexographic printing plates.

For example, Patent Literature 1 proposes, for the infrared ray ablation layer, a technique using a copolymer consisting of a monovinyl-substituted aromatic hydrocarbon and a conjugated diene or a hydrogenated copolymer consisting of a monovinyl-substituted aromatic hydrocarbon and a conjugated diene as a resin. Patent Literature 2 proposes a technique using polyamide as a resin. Patent Literature 3 proposes a technique using partially saponified polyvinyl acetate having a degree of saponification of 60 to 100% by mol and a cationic polymer as a resin. Furthermore, Patent Literature 4 proposes a technique using a modified olefin as a resin.

CITATION LIST

Patent Literature

Patent Literature 1: Japanese Patent No. 4080068
Patent Literature 2: Japanese Patent No. 2916408
Patent Literature 3: Japanese Patent Laid-Open No. 2016-188900
Patent Literature 4: Japanese Patent Laid-Open No. 2015-11330

SUMMARY OF INVENTION

Technical Problem

However, even with the infrared ray ablation layer using the binder described above, it haven't enabled the infrared ray ablation layer to obtain sufficient energy for ablation in micro-patterns (such as 1×1 pixel or 2×2 pixel images) in high resolution such as 8000 DPI, making it difficult to form smaller microcells.

In view of the above-described problems of the conventional techniques, an object of the present invention is to provide a photosensitive resin structure for a flexographic printing plate, having an infrared ray ablation layer with excellent laser sensitivity even when sufficient drawing energy cannot be obtained due to enhancement of resolution, and a method for producing a flexographic printing plate using the same.

Solution to Problem

The present inventors have conducted diligent studies in order to solve the problems and have found that the above-described problems can be solved by a photosensitive resin structure for a flexographic printing plate, having a photosensitive resin composition layer, and an infrared ray ablation layer having a specific configuration, and thereby completed the present invention.

That is, the present invention is as follows.

[1]

A photosensitive resin structure for a flexographic printing plate, comprising:

a support (a);

a photosensitive resin composition layer (b) laminated on the support (a); and an infrared ray ablation layer (c) laminated on the photosensitive resin composition layer (b), wherein the infrared ray ablation layer (c) contains a resin having a constituent unit c1 represented by the following formula (1):

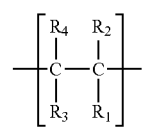

Formula (1)

wherein $R_1$ and $R_2$ each independently represent a non-polar group, and $R_3$ and $R_4$ each independently represent a hydrogen atom or a non-polar group.

[2]

The photosensitive resin structure for the flexographic printing plate according to [1], wherein a content of the constituent unit (c1) is 40% by mass or more and 100% by mass or less based on a total amount of the resin.

[3]

The photosensitive resin structure for the flexographic printing plate according to [1] or [2], wherein $R_3$ and $R_4$ of the formula (1) are each independently a hydrogen atom, an alkyl group, an aryl group, a cycloalkyl group, a phenyl group, an alkenyl group, an aralkyl group, a cycloalkenyl group, an alkynyl group, a silyl group, or a siloxanyl group.

[4]

The photosensitive resin structure for the flexographic printing plate according to any one of [1] to [3], wherein $R_3$ and $R_4$ of the formula (1) are a hydrogen atom.

[5]

The photosensitive resin structure for the flexographic printing plate according to any one of [1] to [4], wherein $R_1$ and $R_2$ of the formula (1) are each independently an alkyl group, an aryl group, a cycloalkyl group, a phenyl group, an alkenyl group, an aralkyl group, a cycloalkenyl group, an alkynyl group, a silyl group, or a siloxanyl group.

[6]

The photosensitive resin structure for the flexographic printing plate according to any one of [1] to [5], wherein $R_1$ and $R_2$ of the formula (1) are each independently an alkyl group or a phenyl group.

[7]

The photosensitive resin structure for the flexographic printing plate according to any one of [1] to [6], wherein $R_1$ and $R_2$ of the formula (1) are an alkyl group.

[8]

The photosensitive resin structure for the flexographic printing plate according to any one of [1] to [7], wherein the resin further has a constituent unit (c2) which is different from the constituent unit (c1) and has an aromatic group in a side chain.

[9]

The photosensitive resin structure for the flexographic printing plate according to any one of [1] to [8], wherein the constituent unit (c2) includes a constituent unit derived from a monovinyl-substituted aromatic hydrocarbon.

[10]

The photosensitive resin structure for the flexographic printing plate according to any one of [1] to [9], wherein the infrared ray ablation layer (c) comprises carbon black, and pH of the carbon black is 2.0 or higher and 5.0 or lower.

[11]

The photosensitive resin structure for the flexographic printing plate according to any one of [1] to [10], wherein the infrared ray ablation layer (c) comprises a dispersant, and a solubility parameter (SP value) of the dispersant is 9.5 or more and 12.5 or less.

[12]

The photosensitive resin structure for the flexographic printing plate according to any one of [1] to [11], wherein a mixing ratio of the resin to the carbon black (resin/carbon black) in the infrared ray ablation layer (c) is in a range of 80/20 to 50/50.

[13]

A method for producing a flexographic printing plate, using the photosensitive resin structure for the flexographic printing plate according to any one of [1] to [12], and comprising:

a first step of performing ultraviolet ray irradiation from a side of the support (a);

a second step of drawing and processing a pattern on the infrared ray ablation layer (c) by infrared ray irradiation;

a third step of irradiating the photosensitive resin composition layer (b) with an ultraviolet ray for pattern exposure using, as a mask, the infrared ray ablation layer (c) on which the pattern is drawn and processed; and a fourth step of removing the infrared ray ablation layer (c) and an unexposed portion of the photosensitive resin composition layer (b).

A flexographic printing method using the photosensitive resin structure for the flexographic printing plate according to any one of [1] to [12], and comprising:

a first step of performing ultraviolet ray irradiation from a side of the support (a);

a second step of drawing and processing a pattern on the infrared ray ablation layer (c) by infrared ray irradiation;

a third step of irradiating the photosensitive resin composition layer (b) with an ultraviolet ray for pattern exposure using, as a mask, the infrared ray ablation layer (c) on which the pattern is drawn and processed;

a fourth step of removing the infrared ray ablation layer (c) and an unexposed portion of the photosensitive resin composition layer (b) to produce a flexographic printing plate; and a fifth step of performing printing using the flexographic printing plate.

Advantageous Effects of Invention

The present invention can provide a photosensitive resin structure for a flexographic printing plate, having an infrared ray ablation layer with excellent laser sensitivity even when sufficient drawing energy cannot be obtained due to enhancement of resolution, and a method for producing a flexographic printing plate using the same.

BRIEF DESCRIPTION OF DRAWINGS

FIG. 1 is a schematic cross-section view of the photosensitive resin structure for a flexographic printing plate according to the present embodiment.

FIG. 2 is a schematic diagram illustrating a method for producing the flexographic printing plate using a photosensitive resin structure for a flexographic printing plate according to the present embodiment.

DESCRIPTION OF EMBODIMENTS

Hereinafter, an embodiment for carrying out the present invention (hereinafter, referred to as "present embodiment") will be described in detail, but the present invention is not limited thereto, and various variations can be made without departing from the scope thereof.

[Photosensitive Resin Structure for Flexographic Printing Plate]

The photosensitive resin structure for a flexographic printing plate according to the present embodiment comprises: a support (a); a photosensitive resin composition layer (b) laminated on the support (a); and an infrared ray ablation layer (c) laminated on the photosensitive resin composition layer (b), wherein the infrared ray ablation layer (c) comprises a resin having a constituent unit (c1) represented by the following formula (1):

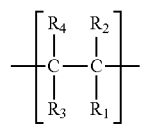

Formula (1)

wherein $R_1$ and $R_2$ each independently represent a non-polar group, and $R_3$ and $R_4$ each independently represent a hydrogen atom or a non-polar group.

FIG. 1 is a schematic cross-section of the photosensitive resin structure for a flexographic printing plate according to the present embodiment (hereinafter also referred to simply as "the present structure"). The present structure is a laminated structure of a support (a), a photosensitive resin composition layer (b) on which a convexo-concave pattern of a flexographic printing plate is formed, and an infrared ray ablation layer (c) that functions as a mask when the convexo-concave pattern is formed. Other layers may be provided between each layer as needed. Hereinafter, the present structure is described in detail.

(Support (a))

Examples of the support (a) for use in the present structure include, but are not particularly limited to, a polyester film, a polyamide film, a polyacrylonitrile film, and a polyvinyl chloride film.

Among these, the support (a) is preferably a polyester film. Examples of the polyester used for the support (a) include, but are not particularly limited to, polyethylene terephthalate, polybutylene terephthalate, and polyethylene naphthalate.

The thickness of the support (a) is not particularly limited, but is preferably 50 to 300 μm.

An adhesive layer may be provided on the support (a) in order to enhance the adhesive force between the support (a) and the photosensitive resin composition layer (b) which will be described later. Examples of the adhesive layer include, but are not particularly limited to, the adhesive layer described in International Publication No. WO 2004/104701.

(Photosensitive Resin Composition Layer (b))

The present structure has a photosensitive resin composition layer (b) on the support (a). The photosensitive resin composition layer (b) may be laminated directly on the support (a), or may be indirectly laminated via the above-described adhesive layer or the like.

The photosensitive resin composition layer (b) may contain, for example, but without particularly limiting, a thermoplastic elastomer (b-1), and preferably further contain an ethylenically unsaturated compound (b-2), a photopolymerization initiator (b-3), and a liquid diene. The photosensitive resin composition layer (b) may further contain an auxiliary additive component, if necessary. Hereinafter, each component is described in detail.

<Thermoplastic Elastomer (b-1)>

Examples of the thermoplastic elastomer (b-1) include, but are not particularly limited to, a copolymer having a constituent unit derived from a monovinyl-substituted aromatic hydrocarbon and a constituent unit derived from a conjugated diene. The thermoplastic elastomer (b-1) may further have a constituent unit derived from other monomers. The use of such a thermoplastic elastomer tends to further improve the printing durability of a flexographic printing plate produced using the present structure.

The thermoplastic elastomer (b-1) may be a random copolymer or a block copolymer, but is preferably a block copolymer having a polymer block formed from a monovinyl-substituted aromatic hydrocarbon and a polymer block formed from a conjugated diene. The use of such a thermoplastic elastomer tends to further improve a printing durability of the flexographic printing plate produced using the present structure.

Examples of the monovinyl-substituted aromatic hydrocarbon that constitutes the thermoplastic elastomer (b-1) include, but are not particularly limited to, styrene, t-butylstyrene, 1,1-diphenylethylene, N,N-dimethyl-p-aminoethylstyrene, N,N-diethyl-p-aminoethylstyrene, vinylpyridine, p-methylstyrene, p-methoxystyrene, tertiary-butylstyrene, α-methylstyrene, and 1,1-diphenylethylene. These may be used singly or in combinations of two or more thereof.

Among these, the monovinyl-substituted aromatic hydrocarbon is preferably styrene, from the viewpoint of enabling the photosensitive resin composition layer (b) to be molded smoothly at a relatively low temperature.

Examples of the conjugated diene that constitutes the thermoplastic elastomer (b-1) include, but are not particularly limited to, butadiene, isoprene, 2,3-dimethyl-1,3-butadiene, 2-methyl-1,3-pentadiene, 1,3-hexadiene, 4,5-diethyl-1,3-octadiene, 3-butyl-1,3-octadiene, and chloroprene. These may be used singly or in combinations of two or more thereof.

Among these, the conjugated diene is preferably butadiene in view of the printing durability of the flexographic printing plate produced using the present structure.

The thermoplastic elastomer (b-1) preferably has a number average molecular weight (Mn) of 20,000 or more and 300,000 or less, and more preferably 50,000 or more and 200,000 or less from the viewpoint of viscosity at normal temperature. The number average molecular weight can be measured by gel permeation chromatography (GPC) and is expressed by a molecular weight in terms of polystyrene.

When the thermoplastic elastomer (b-1) is a block copolymer having a polymer block formed from a monovinyl-substituted aromatic hydrocarbon and a polymer block formed from a conjugated diene, examples of the thermoplastic elastomer (b-1) include linear block copolymers represented by the following formula group (I) and/or linear block copolymers or radial block copolymers represented by the following formula group (II).

$(A-B)_n, A-(B-A)_n, A-(B-A)_n-B, B-(A-B)_n$  Formula group (I):

$[(A-B)_k]_m—X, [(A-B)_k-A]_m-X, [(B-A)_k]_m-X, [(B-A)_k-B]_m—X$  Formula group (II):

In the formula group (I) and the formula group (II), A represents a polymeric block consisting of a monovinyl-substituted aromatic hydrocarbon. Also, B represents a polymeric block consisting of a conjugated diene. X represents a residual group of a coupling agent such as silicon tetrachloride, tin tetrachloride, epoxidized soybean oil, a poly(halogenated hydrocarbon) compound, a carboxylic acid ester compound, a polyvinyl compound, a bisphenol type epoxy compound, an alkoxysilane compound, a halogenated silane compound, or an ester-based compound, or a residual group of a polymerization initiator such as a multifunctional organolithium compound.

In the formula group (I) and the formula group (II), n, k, and m each represent an integer of at least one, for example, 1 to 5.

The content of the conjugated diene and of the monovinyl-substituted aromatic hydrocarbon in the thermoplastic elastomer (b-1) can be measured using a nuclear magnetic resonance apparatus (1H-NMR). Specifically, the contents can be measured by using JNM-LA400 (manufactured by JEOL Ltd., trade name) as a $^1$H-NMR measurement device, using deuterated chloroform as a solvent, setting the sample concentration to 50 mg/mL, setting a measurement frequency at 400 MHz, using tetramethylsilane (TMS) as a standard of chemical shifts, and setting a pulse delay to 2.904 seconds, the number of times of scanning to 64, a pulse width to 45°, and a measurement temperature to 25° C.

The copolymerization ratio (mass ratio) of the monovinyl-substituted aromatic hydrocarbon to the conjugated diene in the thermoplastic elastomer (b-1) is preferably monovinyl-substituted aromatic hydrocarbon/conjugated diene=10/80 to 90/20, more preferably 10/90 to 85/15, and still more preferably 10/90 to 60/40 from the viewpoint of the printing durability of a flexographic printing plate produced using the present structure.

When the proportion of the monovinyl-substituted aromatic hydrocarbon in the copolymerization ratio (mass ratio) is 10 or more, a sufficient hardness is obtained in the photosensitive resin composition layer (b), so that appropriate printing can be performed by usual printing pressure. When the proportion of the monovinyl-substituted aromatic hydrocarbon in the copolymerization ratio (mass ratio) is 90 or less, an appropriate hardness is obtained in the photosensitive resin composition layer (b), so that inks can be sufficiently transferred to an object of printing in the printing process.

If necessary, another functional group may be introduced, a chemical modification such as hydrogenation may be performed, or another component may be copolymerized in the thermoplastic elastomer (b-1).

The content of the thermoplastic elastomer (b-1) in the photosensitive resin composition layer (b) is preferably 40% by mass or more, more preferably 40% by mass or more and 80% by mass or less, further preferably 45% by mass or more and 80% by mass or less, and further more preferably 45% by mass or more and 75% by mass or less when the whole amount of the photosensitive resin composition layer (b) is assumed to be 100% by mass from the viewpoint of printing durability of a flexographic printing plate obtained using the present structure.

<Ethylenically Unsaturated Compound (b-2)>

The photosensitive resin composition layer (b) preferably contains an ethylenically unsaturated compound (b-2), as described above. The ethylenically unsaturated compound (b-2) is a compound having a radically polymerizable unsaturated double bond.

Examples of the ethylenically unsaturated compound (b-2) include, but are not particularly limited to, olefins such as ethylene, propylene, vinyltoluene, styrene, and divinylbenzene; acetylenes; (meth)acrylic acid and/or derivatives thereof; haloolefins; unsaturated nitriles such as acrylonitrile; unsaturated amides such as acrylamide or methacrylamide, and derivatives thereof; unsaturated dicarboxylic acids and derivatives thereof such as maleic anhydride, maleic acid, and fumaric acid; vinyl acetates; N-vinylpyrrolidone; N-vinylcarbazole; and N-substituted maleimide compounds.

Among these, from the viewpoint of ultraviolet ray curability and printing durability of the photosensitive resin composition layer (b) after curing, the ethylenically unsaturated compound (b-2) is preferably (meth)acrylic acid and/or derivatives thereof.

Examples of each of the derivatives include, but are not particularly limited to, an alicyclic compound having a cycloalkyl group, a bicycloalkyl group, a cycloalkenyl group, a bicycloalkenyl group, or the like; an aromatic compound having a benzyl group, a phenyl group, a phenoxy group, a naphthalene skeleton, an anthracene skeleton, a biphenyl skeleton, a phenanthrene skeleton, a fluorene skeleton, or the like; a compound having an alkyl group, a halogenated alkyl group, an alkoxyalkyl group, a hydroxyalkyl group, an aminoalkyl group, a glycidyl group, or the like; an ester compound with a polyhydric alcohol such as an alkylene glycol, a polyoxyalkylene glycol, a polyalkylene glycol, or trimethylolpropane; and a compound having a polysiloxane structure, such as polydimethylsiloxane and polydiethylsiloxane.

In addition, the ethylenically unsaturated compound (b-2) may be a heteroaromatic compound containing an element such as nitrogen or sulfur.

Examples of the (meth)acrylic acid and/or derivatives thereof include, but are not particularly limited to, a diacrylate and a dimethacrylate of an alkanediol such as hexanediol or nonanediol; a diacrylate and a dimethacrylate of ethylene glycol, diethylene glycol, propylene glycol, dipropylene glycol, polyethylene glycol, or butylene glycol; trimethylolpropane tri(meth)acrylate; dimethylol tricyclodecane di(meth)acrylate; isobornyl (meth)acylate; phenoxy polyethylene glycol (meth)acrylate; and pentaerythrit tetra(meth)acrylate. These may be used singly or in combinations of two or more thereof.

From the viewpoint of the mechanical strength of a flexographic printing plate obtained using the present structure, at least one (meth)acrylate is preferably used, and at least one bifunctional (meth)acrylate is more preferably used as the ethylenically unsaturated compound (b-2).

The number average molecular weight (Mn) of the ethylenically unsaturated compound (b-2) is preferably 100 or more from the viewpoint of improving nonvolatility of the ethylenically unsaturated compound (b-2) during production and/or storage of the present structure, preferably less than 1000 from the viewpoint of compatibility with the other components, and more preferably 200 or more and 800 or less.

The content of the ethylenically unsaturated compound (b-2) in the photosensitive resin composition layer (b) is preferably 2% by mass or more and 30% by mass or less, more preferably 2% by mass or more and 25% by mass or less, and further preferably 2% by mass or more and 20% by mass or less when the whole amount of the photosensitive resin composition layer (b) is assumed to be 100% by mass from the viewpoint of printing durability of a flexographic printing plate obtained using the present structure.

<Photopolymerization Initiator (b-3)>

The photosensitive resin composition layer (b) preferably contains a photopolymerization initiator (b-3). The photopolymerization initiator (b-3) is a compound that absorbs the energy of light to produce a radical. Examples thereof include a degradable photopolymerization initiator, a hydrogen abstraction type photopolymerization initiator, and a compound having a site functioning as a hydrogen abstraction type photopolymerization initiator and a site functioning as a degradable photopolymerization initiator in the same molecule.

Examples of the photopolymerization initiator (b-3) include, but are not particularly limited to, benzophenones such as benzophenone, 4,4-bis(diethylamino)benzophenone, 3,3',4,4'-benzophenone tetracarboxylic anhydride, and 3,3',4,4'-tetramethoxy benzophenone; anthraquinones such as t-butyl anthraquinone and 2-ethyl anthraquinone; thioxanthones such as 2,4-diethyl thioxanthone, isopropyl thioxanthone, and 2,4-dichloro thioxanthone; Michler's ketone; acetophenones such as diethoxyacetophenone, 2,2-dimethoxy-2-phenylacetophenone, 2-hydroxy-2-methyl-1-phenylpropan-1-one, benzyl dimethyl ketal, 1-hydroxycyclohexyl-phenyl ketone, 2-methyl-2-morpholino(4-thiomethylphenyl)propan-1-one, 2-methyl-1-(4-methylthiophenyl)-2-morpholino-propan-1-one, 2-benzyl-2-dimethylamino-1-(4-morpholinophenyl)-butanone, and trichloroacetophenone; benzoin ethers such as benzoin methyl ether, benzoin ethyl ether, benzoin isopropyl ether, and benzoin isobutyl ether; acylphosphine oxides such as 2,4,6-trimethylbenzoyl diphenyl phosphine oxide, bis(2,6-dimethoxybenzoyl)-2,4,4-trimethyl pentyl phosphine oxide, and bis(2,4,6-trimethylbenzoyl)-phenyl phosphine oxide; methyl benzoylformate; 1,7-bisacridinyl heptane; 9-phenyl acridine; and azo compounds such as azobisisobutyronitrile, diazonium compounds, and tetrazene compounds. These may be used singly or in combinations of two or more thereof.

Among these, in view of the printing durability of the flexographic printing plate produced using the present structure, the photopolymerization initiator (b-3) is preferably a compound having a carbonyl group, and more preferably an aromatic carbonyl compound such as benzophenones or thioxanthones.

The content of the photopolymerization initiator (b-3) in the photosensitive resin composition layer (b) is preferably 0.1% by mass or more and 10% by mass or less, more preferably 0.1% by mass or more and 5% by mass or less, and further preferably 0.5% by mass or more and 5% by mass or less when the whole amount of the photosensitive resin composition layer (b) is assumed to be 100% by mass from the viewpoint of printing durability of a flexographic printing plate produced using the present structure.

<Liquid Diene>

The photosensitive resin composition layer (b) preferably contains a liquid diene. The liquid diene is a liquid compound having a carbon-carbon double bond. In the present specification, "liquid" in the "liquid diene" means a characteristic having the property of being easily flow-deformable and capable of being solidified into a deformed shape by cooling. The liquid diene has an elastomeric property including the following property: when an external force is applied, deformation occurs instantly depending on the external force, and when the external force is removed, the original shape is recovered in a short time.

Examples of the liquid diene include, but are not particularly limited to, liquid polybutadiene, liquid polyisoprene, a modified product of liquid polybutadiene, a modified product of liquid polyisoprene, a liquid acrylonitrile-butadiene copolymer, and a liquid styrene-butadiene copolymer. The liquid diene is defined as a copolymer having a diene component of 50% by mass or more.

Among these, the liquid diene is preferably liquid polybutadiene from the viewpoint of the mechanical properties of the present structure, and the mechanical properties of a flexographic printing plate using the same.

The amount of 1,2-vinyl bond in the liquid diene, preferably liquid polybutadiene, is preferably 1% or more and 80% or less, more preferably 5% or more and 70% or less, and still more preferably 5% or more and 65% or less from the viewpoint of making the hardness of the present structure, and the hardness of a flexographic printing plate using the same appropriate.

The amount of the 1,2-vinyl bond is a proportion of a conjugated diene monomer incorporated by a 1,2-bond in conjugated diene monomers incorporated by bonding forms of the 1,2-bond, a 3,4-bond, and a 1,4-bond. The amount of the 1,2-vinyl bond can be determined from the peak ratio of the 1H-NMR (magnetic resonance spectrum) of liquid polybutadiene.

1,2-Polybutadiene, which is the liquid polybutadiene having the 1,2-vinyl bond, is highly reactive in radical polymerization and is preferable from the viewpoint of enhancing the hardness of the photosensitive resin composition layer (b) because vinyl, which has a double bond, forms a side chain.

The liquid polybutadiene is usually a mixture of 1,2-polybutadiene having the 1,2-vinyl bond and 1,4-polybutadiene having the 1,4-vinyl bond, and it is effective that 1,4-polybutadiene is contained in the liquid diene in order to improve the softness of the present structure, and the softness of a flexographic printing plate using the same. 1,4-Polybutadiene includes cis-1,4-polybutadiene and trans-1,4-polybutadiene. Any of cis- and trans-1,4-polybutadiene has a low reactivity in radical polymerization because a vinyl group, which has a double bond, exists inside, so that a soft resin can be formed.

When a plurality of liquid polybutadienes each having a different amount of the 1,2-vinyl bond are mixed and used, the average value of the amounts is defined as the amount of the 1,2-vinyl bond.

From the viewpoint of capable of adjusting the reactivity of the photosensitive resin composition layer (b) easily, the whole amount of the 1,2-vinyl bond is preferably adjusted by mixing liquid polybutadiene having an amount of the 1,2-vinyl bond of 10% or less and liquid polybutadiene having an amount of the 1,2-vinyl bond of 80% or more. The whole amount of the 1,2-vinyl bond is preferably adjusted by mixing liquid polybutadiene having an amount of the 1,2-vinyl bond of 5% or less and liquid polybutadiene having an amount of the 1,2-vinyl bond of 80% or more, more preferably.

The number average molecular weight of the liquid diene is not particularly limited as long as it is liquid at 20° C., but is preferably 500 or more and 60000 or less, more preferably 500 or more and 50000 or less, and still more preferably 800 or more and 50000 or less from the viewpoint of the printing durability and handling properties of a flexographic printing plate obtained using the present structure.

The content of the liquid diene in the photosensitive resin composition layer (b) is preferably 10% by mass or more and 40% by mass or less, more preferably 15% by mass or more and 40% by mass or less, and still more preferably 20% by mass or more and 40% by mass or less when the whole amount of the photosensitive resin composition layer (b) is assumed to be 100% by mass from the viewpoint of the printing durability of the present structure, and the printing durability of a flexographic printing plate using the same.

<Auxiliary Additive Component>

The auxiliary additive component is not particularly limited, and examples thereof include a polar group-containing polymer, a plasticizer other than a liquid diene, a thermal polymerization inhibitor other than a stabilizer, an antioxidant, an ultraviolet ray absorber, and a dye or pigment.

Examples of the polar group-containing polymer include, but are not particularly limited to, a water-soluble or water-dispersible copolymer having a polar group such as a hydrophilic group, such as a carboxyl group, an amino group, a hydroxy group, a phosphate group, or a sulfate group, and a salt thereof. More specific examples thereof include an acrylonitrile-butadiene rubber containing a carboxyl group, a styrene-butadiene rubber containing a carboxyl group, a polymer of a carboxyl group-containing aliphatic conjugated diene, an emulsified polymer of an ethylenically unsaturated compound having a phosphate group or a carboxyl group, sulfate group-containing polyurethane, and carboxyl group-containing butadiene latex. These polar group-containing polymers may be used singly or in combinations of two or more thereof.

Among these, from the viewpoint of obtaining a high resolution in a flexographic printing plate using the present structure, the polar group-containing polymer is preferably carboxyl group-containing butadiene latex.

Examples of the plasticizer other than the liquid dienes include, but are not particularly limited to, a hydrocarbon oil such as naphthene oil and paraffin oil; a conjugated diene rubber mainly composed of a liquid diene, such as a liquid acrylonitrile-butadiene copolymer or a liquid styrene-butadiene copolymer; a polystyrene having a number average molecular weight of 2000 or less; and an ester-based plasticizer such as a sebacic acid ester or a phthalic acid ester. These other plasticizers may have a hydroxyl group or a carboxyl group. In addition, a photopolymerizable, reactive group such as a (meth)acryloyl group may be added thereto. The other plasticizers may be used singly, or two or more thereof may be used together.

As the thermal polymerization inhibitor and the antioxidant, those usually used in the field of resin materials or rubber materials can be used. Specific examples thereof include a phenol-based material.

Examples of the phenol-based material include, but are not particularly limited to, vitamin E, tetrakis-(methylene-3-(3',5'-di-t-butyl-4'-hydroxyphenyl)propionate)methane, 2,5-di-t-butylhydroquinone, 2,6-di-t-butyl-p-cresol, and 2-t-butyl-6-(3-t-butyl-2-hydroxy-5-methylbenzyl)-4-methylphenyl acrylate. The thermal polymerization inhibitor and the antioxidant may be used singly or in combinations of two or more thereof.

Examples of the ultraviolet ray absorber include, but are not particularly limited to, known benzophenone-based, salicylate-based, acrylonitrile-based, metal complex-based, or hindered amine-based compounds. The dye or pigment described below may also be used as the ultraviolet ray absorber.

Examples of the ultraviolet ray absorber include, but are not particularly limited to, 2-ethoxy-2'-ethyloxalic acid bisanilide, and 2,2'-dihydroxy-4-methoxybenzophenone.

The dye or pigment is effective as coloring means for improving visibility.

Examples of the dye include, but are not particularly limited to, a basic dye, an acid dye, and a direct dye, which are water-soluble, and a sulfur dye, an oil-soluble dye, and a disperse dye, which are non-water-soluble. Particularly, an anthraquinone-based dye, an indigoid-based dye, and an azo-based dye are preferable, and an azo-based oil-soluble dye and the like are more preferable.

Examples of the pigment include, but are not particularly limited to, a natural pigment, a synthetic inorganic pigment, and a synthetic organic pigment. Examples of the synthetic organic pigment include an azo-based pigment, a triphenylmethane-based pigment, a quinoline-based pigment, an anthraquinone-based pigment, and a phthalocyanine-based pigment.

The total amount of the above-described auxiliary additive components to be added is preferably 0% by mass or more and 10% by mass or less, more preferably 0% by mass or more and 5% by mass or less, and still more preferably 0% by mass or more and 3% by mass or less when the whole amount of the photosensitive resin composition layer (b) is assumed to be 100% by mass.

(Infrared Ray Ablation Layer (c))

The present structure comprises an infrared ray ablation layer (c) that is laminated on the above-described photosensitive resin composition layer (b). The infrared ray ablation layer (c) contains a predetermined resin, is ablatable with an infrared laser, and has a function as a layer shielding a light beam other than infrared ray.

For high-definition processing of the infrared ray ablation layer (c), it is necessary to improve the sensitivity of the infrared ray ablation layer (c) to laser. The "high sensitivity to the laser" herein means a volume that is more ablated, particularly, largely ablated in the depth direction, in drawing with the same laser energy.

As a result of the study, the present inventors have found that in order to improve the laser sensitivity of the infrared ray ablation layer (c), it is important that the resin contained in the infrared ray ablation layer is easy to depolymerize. The "depolymerization" is a reverse reaction of polymerization reaction, and refers to a reaction in which a polymer degrades into a monomer.

Infrared irradiation causes the infrared ray ablation layer to instantaneously reach a high temperature of several hundred degrees. At this time, when the resin is easy to depolymerize, the main chain of the resin is efficiently decomposed even in a short period of ablation, thereby rapidly reducing the molecular weight, and being removed from the infrared ray ablation layer. When the resin is difficult to depolymerize, for example, in a resin having a polar group on the side chain, only the degradation of the side chain occurs at the time of ablation, and the cleavage of the main chain is unlikely to occur. Thus, the resin remains in the infrared ray ablation layer even after infrared irradiation. It is known that, when the resin obtained by condensation polymerization is decomposed, the main chain is cleaved after a ring structure is formed. This makes it difficult to reduce the molecular weight in infrared ablation, which is a heat treatment in a short time, and the laser sensitivity becomes poor.

From these mechanisms, it is important that the infrared ray ablation layer (c) contains a resin that is easy to depolymerize. It has been found that the cleavage of the main chain generally tends to start from a thermally unstable part in the polymer, such as a branch. When the branched side chain has polarity, the degradation of the side chain predominantly occurs as described above, and desirably the cleavage of the main chain is unlikely to occur.

It is thus important that the side chain of the resin contained in the infrared ray ablation layer (c) is a non-polar group. In addition, when the cleavage of the main chain progresses, the contribution of chain transfer within or between molecules cannot be ignored. It is thus better that a tertiary hydrogen that is easily withdrawn by chain transfer is not present. That is, it is important that the portion in the symmetrical plane of the branch is also a non-polar group.

(Resin)

The resin contained in the infrared ray ablation layer (c) according to the present embodiment has a constituent unit (c1) including a quaternary carbon atom to which two non-polar groups are attached, as represented by the following formula (1), and may have other constituent units as needed.

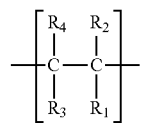

Formula (1)

wherein $R_1$ and $R_2$ each independently represent a non-polar group, and $R_3$ and $R_4$ each independently represent a hydrogen atom or a non-polar group.

In the present embodiment, the "monomer" means a compound prior to polymerization, and the "constituent unit" means a predetermined repeating unit made up by polymerization of the monomer.

The non-polar group in the above formula (1) is not particularly limited as long as it is a group composed of a carbon atom and/or a silicon atom and a hydrogen atom, and examples thereof include an alkyl group, an aryl group, a cycloalkyl group, a phenyl group, an alkenyl group, an aralkyl group, a cycloalkenyl group, an alkynyl group, a silyl group, and a siloxanyl group. The non-polar group does not contain a hydrogen atom.

Among these, in view of the laser sensitivity of the infrared ray ablation layer (c), it is preferable that the group represented by $R_1$, $R_2$, $R_3$, and $R_4$ is an alkyl group or a phenyl group, and it is more preferable that the group represented by $R_1$ and $R_2$ is an alkyl group or a phenyl group, and the non-polar group of $R_3$ and $R_4$ is an alkyl group or a phenyl group; or the group represented by $R_1$ and $R_2$ is an alkyl group or a phenyl group, and $R_3$ and $R_4$ both are a hydrogen atom. As a result, the developability for a solvent-based developing solution, which will be described later, tends to be further improved. Furthermore, the configuration described above further improves the dispersibility of carbon black described later, which tends to further improve the developability for a water-based developing solution.

Among these, in view of the developability for water-based and solvent-based developing solutions described later, the group indicated by $R_1$ is preferably an alkyl group, a phenyl group, and an acyl group.

The number of carbon in the non-polar group is preferably 1 or more and 20 or less, more preferably 1 or more and 10 or less, further preferably 1 or more and 5 or less.

Examples of the monomer that meets formula (1) include, but are not particularly limited to, isobutylene, 2-methyl-2-butene, 2,3-dimethyl-2-butene, and those in which a methyl group in these is substituted with another alkyl group, such as an ethyl group, or their derivative; α-methylstyrene, cis-(1-methyl-1-propenyl)benzene, trans-(1-methyl-1-propenyl)benzene, and those in which a methyl group in these is substituted with another alkyl group, such as an ethyl group, or their derivative; and 1,1-diphenylethylene.

Having a constituent unit (c1) in the resin enables not only the resin itself to have excellent developability for a solvent-based developing solution, but also the high polarity carbon black described later to be dispersed while maintaining the high dispersibility, leading to express high developability for a water-based developing solution.

In the formula (1), it is preferable that $R_3$ and $R_4$ are a hydrogen atom, an alkyl group, an aryl group, a cycloalkyl group, a phenyl group, an alkenyl group, an aralkyl group, a cycloalkenyl group, an alkynyl group, a silyl group, or a siloxanyl group, and more preferably both are a hydrogen atom. This further improves the depolymerization property of the resin, which tends to further improve the laser sensitivity of the infrared ray ablation layer (c). Furthermore, the developability for a solvent-based developing solution is further improved, and the dispersibility of carbon black is further improved, which tends to further improve developability for a water-based developing solution.

Specific examples of the monomer satisfying such configuration include isobutylene, α-methylstyrene, and those in which a methyl group of these have been replaced by another alkyl group such as an ethyl group. It should be noted that the pinhole resistance of the infrared ray ablation layer (c) tends to be further improved by using a monomer having a phenyl group such as α-methylstyrene. Using such a monomer also tends to further improve the developability for water-based and solvent-based developing solutions.

In the formula (1), it is preferable that $R_1$ and $R_2$ are each independently an alkyl group, an aryl group, a cycloalkyl group, a phenyl group, an alkenyl group, an aralkyl group, a cycloalkenyl group, an alkynyl group, a silyl group, or a siloxanyl group, more preferably an alkyl group or a phenyl group, and further preferably, each independently, an alkyl group. When $R_1$ and/or $R_2$ are an alkyl group, rubbery elasticity can be obtained. Accordingly, a soft part in an elastomer can be made, and the flexibility of the infrared ray ablation layer (c) tends to be further improved. Further, when $R_1$ and/or $R_2$ are a phenyl group, the present structure tends to be able to be molded smoothly at a relatively low temperature.

The constituent unit (c1) may be used singly or in combination of two or more thereof. For example, the resin may have, as constituent units (c1), a constituent unit in which $R_1$ and $R_2$ are an alkyl group, and a constituent unit in which one of $R_1$ and $R_2$ is an alkyl group and the other is a phenyl group. This can improve the properties of the alkyl group and the phenyl group both.

Specific examples of the monomer satisfying such structure include isobutylene, and those in which a methyl group of these has been replaced by another alkyl group such as an ethyl group.

The content of the constituent unit (c1) is preferably 40% by mass or more, more preferably 50% by mass or more, further preferably 60% by mass or more, furthermore preferably 70% by mass or more, and still more preferably 80% by mass or more, of the total amount of the resin. Further, the content of the constituent unit (c1) is preferably 100% by mass or less, more preferably 95% by mass or less, further preferably 90% by mass or less, furthermore preferably 85% by mass or less, and still more preferably 80% by mass or less, of the total amount of the resin. The upper and lower limits of these numbers can be optionally combined.

When the content of the constituent unit (c1) is 40% by mass or more, the laser sensitivity and flexibility of the infrared ray ablation layer (c) tend to be further improved. Furthermore, when the content of the constituent unit (c1) is 100% by mass or less, the pinhole resistance of infrared ray ablation layer (c) tends to be further improved.

Furthermore, when the content of the constituent unit (c1) is within the above range, the developability for a solvent-based developing solution is further improved, and the dispersibility of carbon black is further improved, which tends to further improve developability for a water-based developing solution.

The resin used in the infrared ray ablation layer (c) preferably contains, besides the constituent unit (c1), a constituent unit (c2) containing an aromatic group in the side chain. As the constituent unit (c2), a constituent unit (c2) derived from a monovinyl-substituted aromatic hydrocarbon is preferred. The monovinyl aromatic hydrocarbon may be chemically bonded to the monomer represented by formula (1), or may be added as a separate resin, but it is preferred in terms of dispersibility and thereby laser processing uniformity that the monovinyl aromatic hydrocarbon is chemically bonded to the monomer represented by formula (1) to become a copolymer. When the resin contains a constituent unit (c2) derived from a monovinyl-substituted aromatic hydrocarbon, the pinhole resistance tends to be further improved.

Examples of the monovinyl aromatic hydrocarbon compound include, but are not particularly limited to, monomers such as styrene, t-butylstyrene, N,N-dimethyl-p-aminoethylstyrene, N,N-diethyl-p-aminoethylstyrene, vinylpyridine, p-methylstyrene, and tertiary-butylstyrene. Among these, styrene is preferred because the present structure can be molded smoothly at a relatively low temperature. The constituent unit (c2) may be used singly or in combination of two or more thereof.

The content of the constituent unit (c2) is preferably 0% by mass or more, more preferably 5% by mass or more, further preferably 10% by mass or more, furthermore preferably 15% by mass or more, and still more preferably 20% by mass or more, of the total amount of the resin. Further, the content of the constituent unit (c2) is preferably 60% by mass or less, more preferably 55% by mass or less, further preferably 50% by mass or less, furthermore preferably 45% by mass or less, and still more preferably 40% by mass or less, of the total amount of the resin. The upper and lower limits of these numbers can be optionally combined.

When the content of the constituent unit (c2) is 0% by mass or more, the pinhole resistance of the infrared ray ablation layer (c) tends to be further improved. When the content of the constituent unit (c2) is 60% by mass or less, the laser sensitivity and flexibility of the infrared ray ablation layer (c) tend to be further improved. The term "0% by mass or more" refers to both a case containing the constituent unit (c2) and a case not containing the constituent unit (c2). The upper and lower limits of these numbers can be optionally combined.

The content and ratio of the constitutive units (c1) and (c2) in the above-mentioned resin used in the infrared ray ablation layer (c) can be measured using a nuclear magnetic resonance apparatus (1H-NMR).

The infrared ray ablation layer (c) may contain other resin besides the above-mentioned resins. In such a case, the content of the above-mentioned resin is preferably 50% by mass or more, and more preferably 70% by mass or more and 100% by mass or less, of the total resin component of the infrared ray ablation layer (c). When the content of the above-mentioned resin is within the above range, the laser sensitivity and flexibility of the infrared ray ablation layer (c) tend to be further improved. When a resin having a polar group in the side chain is used as the above-mentioned other resin, it is preferable from the viewpoint of laser sensitivity that the content of the above-mentioned resin is 70% or more of all resin components.

The content of the above-mentioned resin is preferably 20% by mass or more, more preferably 30% by mass or more, and further preferably 40% by mass or more based on the total amount of the infrared ray ablation layer (c). Further, the content of the above-mentioned resin is preferably 90% by mass or less, more preferably 80% by mass or less, and further preferably 70% by mass or less based on the total amount of the infrared ray ablation layer (c). The upper and lower limits of these numbers can be optionally combined.

When the content of the above-mentioned resin is 20% by mass or more, the pinhole resistance and flexibility of the infrared ray ablation layer (c) tend to be further improved. When the content of the above-mentioned resin is 90% by mass or less, the laser sensitivity and shielding properties of the infrared ray ablation layer (c) tend to be further improved.

Furthermore, when the content of the above-mentioned resin is within the above range, the developability for the water-based and solvent-based developing solutions and the dispersibility of the carbon black tend to be further improved.

(Infrared Ray Absorbing Substance)

The infrared ray ablation layer (c) may contain an infrared ray absorbing substance for ablation processing. Monomers or compounds having strong absorption in the range of 750 to 2000 nm are usually used as the infrared ray absorbing substance.

Examples of such an infrared ray absorbing substance include, but are not particularly limited to, inorganic pigments such as carbon black, graphite, copper chromite, and chromium oxide; and dyes such as polyphthalocyanine compounds, cyanine dyes, and metal thiolate dyes. The smaller the particle size, the higher the sensitivity to the infrared laser. Carbon black, in particular, can be used in a wide range of particle size of 13 nm or more and 85 nm or less, and is preferred as the infrared ray absorbing substance. Carbon black may also serve as a shielding substance. These infrared ray absorbing substances are added to the extent that they confer a sensitivity that can be removed with the laser light used.

(Shielding Substance)

The infrared ray ablation layer (c), which serves as a mask, may contain a shielding substance against non-infrared rays such as ultraviolet rays. As a shielding substance against non-infrared rays, a substance that reflects or absorbs ultraviolet light can be used. Examples thereof include an ultraviolet ray absorber, carbon black, and graphite.

The total content of the infrared ray absorbing substance and the shielding substance is preferably 10% by mass or more and 80% by mass or less, preferably 20% by mass or more and 70% by mass or less, and preferably 30% by mass or more and 60% by mass or less, based on the total content of the infrared ray ablation layer (c). When the total content of the infrared ray absorbing substance and the shielding substance is within the above range, the laser sensitivity and the shielding properties tend to be further improved.

(Carbon Black)

To make the infrared ray ablation layer (c) exhibit excellent developability for the solvent-based developing solution, it is important that the resin in the infrared ray ablation layer (c) has low polarity. However, when the resin has low polarity, the developability for the water-based developing solution decreases. On the other hand, to make the infrared ray ablation layer (c) exhibit excellent developability for water-based developing solution, it is important that the resin in the infrared ray ablation layer (c) has high polarity. However, when the resin has high polarity, the developability for the solvent-based developing solution decreases.

Through consideration, it has been found that, by combining a resin having a certain structure with a low-polarity carbon black, the infrared ray ablation layer (c) exhibits excellent developability for both a solvent-based developing solution and a water-based developing solution.

It is preferred that the infrared ray ablation layer (c) according to the present embodiment contains carbon black as an infrared ray absorbing substance for performing ablation processing and as a non-infrared ray shielding substance for serving as a mask.

It is preferred that the pH of carbon black is 2.0 or more and 5.5 or less from the viewpoint of expressing high developability for both a solvent-based developing solution and a water-based developing solution. The low pH carbon black has a large number of functional groups on its surface and is more hydrophilic than conventional carbon black. This makes it possible to exhibit excellent developability, especially for a water-based developing solution.

The pH of carbon black is more preferably 2.5 or higher and 5.0 or lower, and still more preferably 2.5 or higher and 4.5 or lower. The pH of carbon black is a value that is measured by preparing a mixed solution of the carbon black and distilled water, and using a glass electrode pH meter according to ASTM D1512.

Carbon black is classified into, for example, furnace black, channel black, thermal black, acetylene black, and lamp black depending on its production method, and among these, furnace black is preferable for obtaining the desired characteristics.

The furnace black can be obtained by using a widely known method including blowing a petroleum-based or coal-based oil used as a starting material into a high-temperature gas, and making incomplete combustion to obtain carbon clack.

Carbon black that has heretofore been used for forming black matrix can be used as the carbon black as long as it satisfies the above. Specific examples thereof include MA7, MA8, MA11, MA14, MA77, MA100, MA100R, MA100S, MA220, MA230, #970, #1000, #2350, and #2360 manufactured by Mitsubishi Chemical Corporation, and TOKABLACK #8300 manufactured by TOKAI CARBON CO., LTD.

The film thickness of the infrared ray ablation layer (c) in the present structure is preferably larger from the viewpoint of securing light shielding properties for ultraviolet ray during the step of subjecting the photosensitive resin structure for a printing plate to an exposure treatment, and is preferably smaller from the viewpoint of enhancing ablation properties.

The content of carbon black is preferably 10% by mass or more and 70% by mass or less, more preferably 20% by mass or more and 60% by mass or less, and further preferably 30% by mass or more and 50% by mass or less, based on the total amount of the infrared ray ablation layer (c). When the content of carbon black within the above range, the laser sensitivity and the shielding properties tend to be further improved.

The mixing ratio of the resin to carbon black (resin/carbon black) in the infrared ray ablation layer (c) is preferably in the range of 80/20 to 50/50, more preferably in the range of 75/25 to 55/45, and further preferably in the range of 70/30 to 60/40. When the mixing ratio (resin/carbon black) is within the above range, the laser sensitivity and the shielding properties tend to be further improved.

(Dispersant)

The infrared ray ablation layer (c) preferably contains a dispersant for the purpose of assisting the dispersion of carbon black. The dispersant is preferably, a compound having an adsorptive moiety capable of interacting with a surface functional group of an infrared ray absorber, and a resin-compatible moiety capable of being compatible with a binder polymer. The use of such a dispersant further improves the dispersibility of carbon black, which tends to further improve the developability for a water-based developing solution.

Examples of the adsorptive moiety of the dispersant include, but are not particularly limited to, an amino group, an amide group, a urethane group, a carboxyl group, a carbonyl group, a sulfone group, and a nitro group. Among these, an amino group, an amide group, and a urethane group are preferred.

Examples of the resin-compatible moiety include, but are not particularly limited to, saturated alkyl, unsaturated alkyl, polyether, polyester, poly(meth)acryl, and polyol.

The solubility parameter (SP value) of the dispersant is preferably 9.5 or more and 12.5 or less, and more preferably 10.0 or more and 12.0 or less. When a solubility parameter (SP value) within the above range, the dispersibility of carbon black is further improved, which tends to further improve the developability of the water-based developing solution.

The solubility parameter SP value $\delta$ in the present embodiment is defined as in Formula (1) below.

$$\delta = (\Delta E/V)^{1/2} [(cal/cm^3)^{1/2}] \tag{1}$$

wherein V is the molar volume of the solvent and $\Delta E$ is aggregation energy (evaporation energy).

The molar volume of the solvent and the aggregation energy can also be obtained from known values, such as those in the literature "POLYMER ENGINEERING AND SCIENCE, Vol. 14, 147-154, 1974".

When the above parameters are not known, it is also possible to measure the solubility parameter (SP value) using a technique called the cloud point titration method.

Specifically, first, to a solution in which a sample having an unknown SP value is dissolved in a good solvent having a known SP value, a poor solvent having a lower SP value than the above good solvent is added dropwise, and the volume of the poor solvent in which the solute has begun to precipitate is measured. Subsequently, to a solution in which a newly prepared sample having an unknown SP value is dissolved in a good solvent having a known SP value, a poor solvent having a higher SP value than the above good solvent is added dropwise, and the volume of the poor solvent in which the solute has begun to precipitate is measured. By applying the volume of each poor solvent measured here to the following formula (2), the solubility parameter can be obtained.

$$\delta = (V_{ml}^{1/2} \delta_{ml} + V_{mh}^{1/2} \delta_{mh})/(V_{ml}^{1/2} + V_{mh}^{1/2}) \tag{2}$$

wherein $V_{ml}$ is the volume of the poor solvent having a low SP value, $V_{mh}$ is the volume of the poor solvent having a high SP value, $\delta_{ml}$ is the SP value of the poor solvent having a low SP value, and $\delta_{mh}$ is the SP value of the poor solvent having a high SP value.

Note that all of the SP values described in the Examples below are the values measured according to the cloud point titration method described above.

The content of the dispersant of the infrared ray ablation layer (c) according to the present embodiment is preferably selected and added within a range in which the strength of the infrared ray ablation layer (c) can be ensured while uniformly dispersing the infrared ray absorber in the infrared ray ablation layer (c). If the content of the dispersant is small, the infrared ray absorber cannot be sufficiently dispersed in the infrared ray ablation layer (c), but if the content of the dispersant is too large, the strength of the membrane may be reduced and pinholes may occur frequently.

From these viewpoints, the content of the dispersant is preferably 0.1% by mass or more and 50% by mass or less, more preferably 1% by mass or more and 30% by mass or less, and further preferably 3% by mass or more and 20% by mass or less of the whole of the infrared ray ablation layer (c).

In the relationship with carbon black, from the viewpoint of dispersibility of carbon black, the content of the dispersant is preferably 0.5 parts by mass or more, more preferably 1 part by mass or more, and further preferably 3 parts by mass or more based on 100 parts by mass of carbon black. Further, from the viewpoint of the membrane strength of the infrared ray ablation layer, the content of the dispersant is preferably 50 parts by mass or less, more preferably 30 parts by mass or less, and further preferably 20 parts by mass or less based on 100 parts by mass of carbon black.

In the original flexographic printing plate according to the present embodiment, it is preferable that the dispersant of the infrared ray ablation layer (c) has a branched structure. When the dispersant has a branched structure, the crystallinity of the dispersant is low, thus high dispersibility can be obtained.

The weight average molecular weight of the dispersant of the infrared ray ablation layer (c) according to the present embodiment is preferably selected within a range in which the dispersant does not bleed out while the infrared ray absorber is uniformly dispersed in the infrared ray ablation layer.

When the dispersant is bled out, it cannot interact with an infrared ray absorber, such as carbon black, resulting in poor dispersion, heavy peeling, and aggregation of the infrared ray absorber, such as carbon black, causing a pinhole.

From these viewpoints, the weight average molecular weight measured in terms of standard polystyrene by gel permeation column chromatography (GPC) of the dispersing agent is preferably 1,000 or more and 10,000 or less, more preferably 2,000 or more and 7,000 or less, and further preferably 2,500 or more and 5,000 or less.

(Film Thickness)

The film thickness of the infrared ray ablation layer (c) in the present structure is preferably thicker from the viewpoint of securing shielding properties for ultraviolet ray in the step of subjecting the present structure to an exposure treatment, and is preferably thinner from the viewpoint of enhancing ablation properties.

From the above-described viewpoints, the film thickness of the infrared ray ablation layer (c) is preferably 0.1 μm or more and 20 μm or less, more preferably 0.5 μm or more and 15 μm or less, and further preferably 1.0 μm or more and 10 μm or less.

For the non-infrared ray-shielding effect of the infrared ray ablation layer (c), the optical density of the infrared ray ablation layer (c) is preferably 2 or more, and more preferably 3 or more.

The optical density can be measured using D200-II Transmission Densitometer (manufactured by GretagMacbeth LLC). The optical density is so-called ISO visual, and the light to be measured is in a wavelength region on the order of 400 to 750 nm.

Examples of a method for forming the infrared ray ablation layer (c) include, but are not particularly limited to, a method of first preparing a resin solution using a predetermined solvent, adding thereto, when using carbon black as both an infrared ray absorbing substance and a non-infrared ray shielding substance, carbon black and a dispersant to disperse the carbon black in the resin solution, then coating a cover film such as a polyester film with the resulting solution, and then laminating or press pressure-bonding this cover film to the photosensitive resin composition layer (b) for transferring a non-infrared ray-shielding layer ablatable with an infrared laser.

As a method of dispersing carbon black in a resin solution, a method that combines forced stirring by a stirring blade with stirring using ultrasonic waves or various types of mills is effective. Alternatively, a method of preliminarily kneading the resin, the carbon black, and the dispersant using an extruder or a kneader, and then dissolving the resultant in a solvent is also effective for obtaining good dispersibility of the carbon black. Also, the carbon black may be forcedly dispersed into the resin in a latex solution state.

The solvent for a solution, a dispersion, or the like for forming the film of the infrared ray ablation layer (c) can be appropriately selected in consideration of the solubility of the resin or the infrared ray absorber to be used. The solvent may be used singly or as a mixture of two or more solvents.

It is also effective to improve the membrane quality of the infrared ray ablation layer (c), for example, by mixing a relatively low boiling point solvent with a high boiling point solvent to control the solvent volatilization rate.

Examples of the solvent for forming the film of the infrared ray ablation layer (c) include, but are not particularly limited to, toluene, xylene, cyclohexane, methyl acetate, ethyl acetate, propyl acetate, butyl acetate, amyl acetate, methyl ethyl ketone, acetone, cyclohexanone, ethylene glycol, propylene glycol, ethanol, water, propylene glycol monomethyl ether, propylene glycol monomethyl ether acetate, dimethylacetamide, dimethylformamide, n-propyl alcohol, i-propyl alcohol, 1,4-dioxane, tetrahydrofuran, diethyl ether, n-hexane, n-heptane, n-pentane, acetonitrile, and analogs thereof.

The cover film for forming the film of the infrared ray ablation layer (c) of the present structure is preferably a film excellent in dimensional stability and is preferably a polyethylene terephthalate film or the like.

The cover film may be used in an untreated state, but if necessary, a cover film having a function given by a mold release treatment, an antistatic treatment, or the like may be used.

(Intermediate Layer (d))

The present structure may further comprise one or more intermediate layers (d) between the photosensitive resin composition layer (b) and the infrared ray ablation layer (c). The intermediate layer (d) is not particularly limited, but can be, for example, an oxygen inhibition layer, an adhesive layer, and/or a protective layer. Hereinafter, each layer is described.

In order to produce a printed material having a high definition and highlight region, it is necessary to form a fine dot on a flexographic printing plate. From the viewpoint of forming such fine dots, it is preferred that the intermediate layer (d) is an oxygen inhibition layer having an oxygen inhibitory capacity.

When the photosensitive resin composition layer (b) is cured by ultraviolet ray irradiation, the curing proceeds by radical polymerization. When oxygen coexists during this radical polymerization, a radically generated compound and oxygen react to suppress the polymerization reaction. When the polymerization reaction is suppressed in this manner, there is a risk that an unreacted portion will remain in the exposed portion of the photosensitive resin composition layer (b). This unreacted portion is removed in the fourth step described later, and thus the pattern eventually formed in the flexographic printing plate has a shape with a curved portion at the tip. This is because the portion on the infrared ray ablation layer (c) side of the photosensitive resin composition layer (b) is particularly susceptible to polymerization inhibition due to oxygen, and the unreacted portion is likely to occur in the photosensitive resin composition layer (b) directly below the infrared ray ablation layer (c).

In contrast, when the amount of oxygen coexistence during ultraviolet ray curing is reduced, the polymerization reaction is unlikely to be suppressed, and the final formation pattern becomes a shape with a plane portion at the tip. Thus, in the case where a pattern having a flat portion at the tip is to be formed, it is effective to have an intermediate layer (d) having an oxygen inhibitory ability to reduce the oxygen contacting the photosensitive resin composition layer (b).

The intermediate layer (d) may be an adhesive layer that improves the adhesion of the photosensitive resin composition layer (b) and the infrared ray ablation layer (c). This tends to further improve the handling properties.

Furthermore, the intermediate layer (d) may also have a function of protecting the infrared ray ablation layer (c). In the conventional production process of the flexographic printing plate, when the infrared ray ablation layer (c) laminated with the cover film is film fed, the infrared ray ablation layer (c) comes into contact with the roll, or a winding tightening occurs during the transportation of the film roll, thereby the infrared ray ablation layer (c) and the cover film laminated thereon are rubbed in the roll. As a result, the infrared ray ablation layer (c) may be physically missing and a pinhole may occur. Further, when the photosensitive resin composition layer (b) and the infrared ray ablation layer (c) are laminated by a method of extruding and molding the photosensitive resin composition layer (b) and applying it to the infrared ray ablation layer (c), there is a risk that a pinhole will occur due to friction caused when the heated and melted photosensitive resin composition flows over the infrared ray ablation layer (c).

To prevent such an occurrence of pinhole in the infrared ray ablation layer (c), it is preferable that an intermediate layer (d) constituting the present structure has physical strength and heat resistance as a protective layer.

[Method for Producing Flexographic Printing Plate]

The method for producing a flexographic printing plate according to the present embodiment, using the present structure, includes: a first step of performing ultraviolet ray irradiation from a side of the support (a); a second step of drawing and processing a pattern on the infrared ray ablation layer (c) by infrared ray irradiation; a third step of irradiating the photosensitive resin composition layer (b) with an ultraviolet ray for pattern exposure using, as a mask, the infrared ray ablation layer (c) on which the pattern is drawn and processed; and a fourth step of removing the infrared ray ablation layer (c) and an unexposed portion of the photosensitive resin composition layer (b).

If necessary, the step of performing a post-exposure treatment is then performed to obtain a flexographic printing plate (letterpress printing plate) formed from a cured photosensitive resin composition layer. The surface of the flexographic printing plate may be brought into contact with a liquid containing a silicone compound and/or a fluorine compound from the viewpoint of conferring peeling properties.

FIG. 2 shows a schematic diagram illustrating a method for producing a flexographic printing plate using a photosensitive resin structure for a flexographic printing plate according to the present embodiment. Hereinafter, each step is described in detail.

(First Step)

In the first step, the method of performing ultraviolet ray irradiation to the photosensitive resin composition layer (b) from a side of the support (a) is not particularly limited, and can be carried out using a known irradiation unit. The wavelength of ultraviolet ray in the irradiation is preferably 150 to 500 nm, more preferably 300 to 400 nm.

The light source of the ultraviolet ray is not particularly limited, but, for example, a low-pressure mercury lamp, a high-pressure mercury lamp, an ultrahigh-pressure mercury lamp, a metal halide lamp, a xenon lamp, a zirconium lamp, a carbon arc lamp, or a fluorescent lamp for ultraviolet ray can be used.

This first step may be performed before or after the second step described later.

(Second Step)

In the second step, the method for drawing and processing a pattern on the infrared ray ablation layer (c) by infrared ray irradiation is not particularly limited, and can be carried out using a known irradiation unit. The irradiation of infrared ray to the infrared ray ablation layer (c) can be carried out from the side of the infrared ray ablation layer (c).

When the present structure has a cover film, the cover film is first peeled off before the infrared ray irradiation. The infrared ray ablation layer (c) is then pattern-irradiated with an infrared ray to decompose the resin of the irradiated part of the infrared ray, and the pattern is drawn and processed. This makes it possible to form a mask of the infrared ray ablation layer (c) on the photosensitive resin composition layer (b).

In the first step, suitable examples of the infrared laser include ND/YAG laser (for example, 1064 nm) or diode laser (for example, 830 nm). Laser systems suitable for CTP plate making techniques are sold on the market, and, for example, a diode laser system CDI Spark (Esko-Graphics BV.) can be used. This laser system includes: a rotary cylindrical drum that holds the present structure; IR laser irradiation apparatus; and a layout computer, and image information is directly sent from the layout computer to the laser apparatus.

(Third Step)

In the third step, the photosensitive resin composition layer (b) is irradiated with an ultraviolet ray for pattern exposure using, as a mask, the infrared ray ablation layer (c) on which the pattern is drawn and processed. At this time, the light passing through the mask promotes a curing reaction in the photosensitive resin composition layer (b), and a pattern formed in the infrared ray ablation layer (c) is transferred to the photosensitive resin composition layer (b) in which the convex and concave are inverted. Ultraviolet ray irradiation may be performed on the whole surface of the present structure.

The third step can be carried out in a state where the present structure is attached to a laser cylinder, but is generally performed by taking the present structure out of a laser apparatus, and irradiating using a conventional irradiation unit. The same irradiation unit as the one illustrated in the ultraviolet ray irradiation in the first step can be used as the irradiation unit.

(Fourth Step)

The fourth step is a step of removing the infrared ray ablation layer (c) and an unexposed portion of the photosensitive resin composition layer (b). In the fourth step (the developing step, the removing method is not particularly limited, and a conventionally known method can be applied. Specifically, as described above, the photosensitive resin composition layer (b) of the present structure is exposed, and then the unexposed portions are washed with a solvent for solvent development or a washing solution for water development, or the unexposed portions are heated to 40° C. to 200° C. and contacted with a predetermined absorbent layer that can absorb it, and the absorbent layer is removed to get rid of the unexposed portion.

If necessary, a post-exposure treatment is then performed, thereby producing a flexographic printing plate.

When an intermediate layer is located between the infrared ray ablation layer (c) and the photosensitive resin composition layer (b), the intermediate layer (d) may be removed simultaneously in the developing step.

Examples of the solvent for development used for performing solvent development on the unexposed portions include, but are not particularly limited to, esters such as heptyl acetate and 3-methoxybutyl acetate; hydrocarbons such as petroleum fractions, toluene, and decaline; and mixtures obtained by mixing an alcohol such as propanol, butanol, or pentanol with a chlorine-based organic solvent such as tetrachloroethylene. The washing of the unexposed portion is performed by injection from the nozzle or by brushing with a brush.

As the washing solution for water development, water, an alkaline aqueous solution, a neutral detergent, and a surfactant can be suitably used.

Examples of the surfactant include an anionic surfactant, an amphoteric surfactant, and a nonionic surfactant. These may be used singly or as mixtures of two or more thereof.

Examples of the anionic surfactant include, but are not particularly limited to, a sulfuric acid ester salt, a higher alcohol sulfuric acid ester, a higher alkyl ether sulfuric acid ester salt, a sulfated olefin, an alkylbenzenesulfonate, an α-olefinsulfonate, a phosphoric acid ester salt, and dithiophosphoric acid ester salt.

Examples of the amphoteric surfactant include, but are not particularly limited to, an amino acid type amphoteric surfactant and a betaine type amphoteric surfactant.

Examples of the nonionic surfactant include, but are not particularly limited to, polyethylene glycol type surfactants such as an ethylene oxide adduct of a higher alcohol, an ethylene oxide adduct of an alkylphenol, an ethylene oxide adduct of an aliphatic acid, an ethylene oxide adduct of a polyhydric alcohol aliphatic acid ester, an ethylene oxide adduct of a higher alkylamine, an ethylene oxide adduct of an aliphatic acid amide, and an ethylene oxide adduct of polypropylene glycol, and polyhydric alcohol type surfactants such as an aliphatic acid ester of glycerol, an aliphatic acid ester of pentaerythritol, an aliphatic acid ester of sorbitol and of sorbitan, an alkyl ether of a polyhydric alcohol, and an aliphatic acid amide of an alkanolamine.

For the alkaline aqueous solution, a pH modifier may be used. The pH modifier may be any of organic materials and inorganic materials, and preferably enables pH to be adjusted to 9 or higher. Examples of the pH modifier include, but are not particularly limited to, sodium hydroxide, sodium carbonate, potassium carbonate, sodium silicate, sodium metasilicate, and sodium succinate.

Examples of the absorption layer of heat development include, but are not particularly limited to, a nonwoven fabric material, a paper material, a fiber fabric, an open-celled foam, and a porous material. Among these, a nonwoven fabric material consisting of nylon, polyester, polypropylene, or polyethylene, and a combination of these non-woven fabric materials are preferred, and a continuous web of non-woven fabric of nylon or polyester is more preferred.

[Flexographic Printing Method]

The flexographic printing method according to the present embodiment, using the photosensitive resin structure for a flexographic printing plate described above, includes a first step of performing ultraviolet ray irradiation from a side of the support (a); a second step of drawing and processing a pattern on the infrared ray ablation layer (c) by infrared ray irradiation; a third step of irradiating the photosensitive resin composition layer (b) with an ultraviolet ray for pattern exposure using, as a mask, the infrared ray ablation layer (c) on which the pattern is drawn and processed; a fourth step of removing the infrared ray ablation layer (c) and an unexposed portion of the photosensitive resin composition layer (b) to produce a flexographic printing plate; and a fifth step of performing printing using the flexographic printing plate.

The first to fourth steps in the flexographic printing method are as described above.

(Fifth Step)

The fifth step is a step of performing printing using the flexographic printing plate obtained by the first step to the fourth step. The printing method using the flexographic printing plate is not particularly limited as long as the printing method is a method in which ink is attached to a convex portion of the flexographic printing plate and the ink is transferred to a substrate.

EXAMPLES

Hereinafter, the present invention will be described more specifically with reference to specific Examples and Comparative Examples, but the present invention is not limited to the following examples by any means.

[Production of Flexographic Printing Plate]

A photosensitive resin structure for a flexographic printing plate was produced in Examples and Comparative Examples described below.

((1) Production of Laminate of Support and Photosensitive Resin Composition Layer)

60 parts by mass of TUFPRENE A (manufactured by Asahi Kasei Corporation, a styrene-butadiene-styrene block copolymer), 30 parts by mass of B-2000 (manufactured by Nippon Petrochemicals Co., Ltd., liquid polybutadiene), 7 parts by mass of 1,9-nonanediol diacrylate, 2 parts by mass of 2,2-dimethoxy-2-phenylacetophenone, and 0.3 parts by mass of 2,6-di-t-butyl-p-cresol were kneaded using a pressure kneader to prepare a photosensitive resin composition.

Next, the photosensitive resin composition was added to an extruder. Then, to one side of the photosensitive resin composition layer extruded from a T-die was laminated a support (polyethylene terephthalate film), and to the side opposite to the support-laminated side of the photosensitive resin composition layer was laminated a release film (manufactured by Mitsubishi Chemical Corporation, DIAFOIL MRV100), to thereby obtain a laminate of the support and the photosensitive resin composition layer.

((2) Production of Resin Used in Infrared Ray Ablation Layer)

<Production of Resin 1>

After nitrogen replacement in a polymerization vessel of 2 L separable flask, 456.1 mL of n-hexane (dried with molecular sieves) and 656.5 mL of butyl chloride (dried with molecular sieves) were added using a syringe, and the polymerization vessel was cooled in a dry ice/methanol bath at −70° C. Then, a liquid feed tube made of Teflon (registered trademark) was connected to a pressure-resistant glass liquefaction sampling tube with a three-way cock, which contained 161.1 g (2871 mmol) of isobutylene monomer, and the isobutylene monomer was fed into the polymerization vessel by nitrogen pressure. 0.647 g (2.8 mmol) of p-dicumyl chloride and 1.22 g (14 mmol) of N,N-dimethylacetamide were added. Then, 8.67 mL (79.1 mmol) of titanium tetrachloride was further added to start polymerization. After stirring at the same temperature for 1.5 hours from the start of polymerization, about 1 mL of the polymerization solution was extracted from the polymerization solution for sampling. Then, a mixed solution of 77.9 g (748 mmol) of styrene monomer, 23.9 mL of n-hexane and 34.3 mL of butyl chloride, which had been cooled to −70° C. in advance, was added to the polymerized container. 45 minutes after the addition of the mixed solution, about 40 mL of methanol was added to complete the reaction.

The solvent and the like were distilled from the reaction solution, and then the reaction solution was dissolved in toluene, and washed with water twice. Further, the toluene solution was added to a large amount of methanol to precipitate the polymer, and the obtained polymer was dried under vacuum at 60° C. for 24 hours to obtain resin 1. The content ratio of styrene was determined by $^1$H-NMR and found to be 30% by mass.

<Production Examples of Resins 2 to 9>

Resins 2 to 9 were obtained in the same manner as in resin 1 except that the type and mixing ratio of the monomers used were changed as shown in Table 1 below. The materials constituting the resin and the physical properties thereof are shown in Table 1 below.

<Production Examples of Resin 10>

To a container having a stirrer, 2 kg of water, 65 g of calcium triphosphate, 40 g of calcium carbonate, and 0.40 g of sodium lauryl sulfate were charged to obtain a mixed solution. Then, in a 60 L reactor, 25 kg of water was charged and warmed to 80° C., then the mixed solution, 21.5 kg of methyl methacrylate, 110 g of lauroyl peroxide, and 430 g of 2-ethylhexylthioglycolate were added. Subsequently, suspension polymerization was carried out while maintaining the temperature at about 75° C., and then, after the heat generation peak was observed, the temperature was raised to 92° C. at a rate of 1° C./min. The mixture was then aged for 60 minutes to substantially complete the polymerization reaction.

Then, 20% by mass sulfuric acid was charged to cool to 50° C. and dissolve the suspension. The polymerization reaction solution was then subjected to a sieve of 1.68 mm mesh to remove aggregates, and the obtained bead-like polymer was washed and dehydrated to dryness to obtain resin 10.

<Production Example of Infrared Ray Ablation Layer Laminate 11>

7.8 parts by mass of TUFPRENE 315 (manufactured by Asahi Kasei Corporation, styrene-butadiene block copolymer), 70.4 parts by mass of toluene, and 17.6 parts by mass of propylene glycol 1-monomethyl ether 2-acetate (PMA) were mixed to dissolve TUFPRENE 315 in the solvent. Thereafter, carbon black (manufactured by Mitsubishi Chemical Corporation, MCF-88) was further charged, then the mixture was mixed for 4 hours using a bead mill to obtain a carbon black dispersion.

An infrared ray ablation layer laminate 11 was obtained in the same manner as in the infrared ray ablation layer laminate 1 except that the carbon black dispersion obtained above was used.

<Production Example of Infrared Ray Ablation Layer Laminate 12>

7.8 parts by mass of polyamide (manufactured by Henkel AG & Co. KGaA, MACROMELT 6900), 44.0 parts by mass of toluene, and 44.0 parts by mass of 2-propanol were mixed to dissolve the polyamide in the solvent. Thereafter, carbon black (manufactured by Mitsubishi Chemical Corporation, MCF-88) was further charged, then the mixture was mixed for 4 hours using a bead mill to obtain a carbon black dispersion.

TABLE 1

| | | Constituent unit C1 | | | | | Constituent unit C2 | |
| --- | --- | --- | --- | --- | --- | --- | --- | --- |
| | Monomer | Content (wt %) | R1 | R2 | R3 | R4 | Monomer | Content (wt %) |
| Resin 1 | Isobutylene | 70 | —CH3 | —CH3 | —H | —H | Styrene | 30 |
| Resin 2 | Isobutylene | 50 | —CH3 | —CH3 | —H | —H | Styrene | 50 |
| Resin 3 | Isobutylene | 40 | —CH3 | —CH3 | —H | —H | Styrene | 60 |
| Resin 4 | Isobutylene | 85 | —CH3 | —CH3 | —H | —H | Styrene | 15 |
| Resin 5 | Isobutylene | 85 | —CH3 | —CH3 | —H | —H | — | 0 |
| | α-Methylstyrene | 15 | —CH3 | —C6H5 | —H | —H | | |
| Resin 6 | 2-Methyl-1-butene | 70 | —CH2CH3 | —CH3 | —H | —H | Styrene | 30 |
| Resin 7 | 2-Methyl-2-butene | 70 | —CH3 | —CH3 | —CH3 | —H | Styrene | 30 |
| Resin 8 | 2,3-Dimethyl-2-butene | 70 | —CH3 | —CH3 | —CH3 | —CH3 | Styrene | 30 |
| Resin 9 | Isobutylene | 100 | —CH3 | —CH3 | —H | —H | | 0 |
| Resin 10 | Methyl methacrylate | 100 | —COOCH3 | —CH3 | —H | —H | — | 0 |

((3) Production of Infrared Ray Ablation Layer Laminate)

<Production Example of Infrared Ray Ablation Layer Laminate 1>

6.5 parts by mass of resin 1, 54.0 parts by mass of toluene, and 36.0 parts by mass of cyclohexanone were mixed to dissolve resin 1 in the solvent. Subsequently, 3.5 parts by mass of carbon black (manufactured by Mitsubishi Chemical Corporation, #1000) was further added, then the mixture was mixed for 4 hours using a bead mill to obtain a carbon black dispersion.

A 100 μm thick PET film serving as a cover film was coated with the carbon black dispersion obtained above so that the film thickness after drying was 2.5 μm. A drying treatment at 90° C. for 2 minutes was performed to obtain infrared ray ablation layer laminate 1 which was a laminate of the infrared ray ablation layer and the cover film.

<Production Example of Infrared Ray Ablation Layer Laminates 2 to 10>

Infrared ray ablation layer laminates 2 to 10 were obtained in the same manner as in the infrared ray ablation layer laminate 1 except that the resin used was changed as shown in Table 2 below.

An infrared ray ablation layer laminate 12 was obtained in the same manner as in the infrared ray ablation layer laminate 1 except that the carbon black dispersion obtained above was used.

<Production Example of Infrared Ray Ablation Layer Laminate 13>

10 parts by mass of GOHSENOL KL-05 (polyvinyl acetate having a degree of saponification of 78 to 82% by mol, manufactured by Nippon Synthetic Chemical Industry Co., Ltd.), 10 parts by mass of E-caprolactam, 90 parts by mass of a nylon salt of N-(2-aminoethyl)piperazine and adipic acid, and 100 parts by mass of water were placed in a stainless autoclave. After replacing the internal air with nitrogen gas, the heating was performed at 180° C. for 1 hour to prepare a water-soluble polyamide. Subsequently, 10 parts by mass of a water-soluble polyamide obtained by the removal of water were dissolved in 40 parts by mass of water, 20 parts by mass of methanol, 20 parts by mass of n-propanol, and 10 parts by mass of n-butanol to obtain a solution.

The obtained solution was mixed with carbon black (manufactured by Mitsubishi Chemical Corporation,

1000), which was then kneaded and dispersed using a three-roll mill to obtain a carbon black dispersion.

An infrared ray ablation layer laminate 13 was obtained in the same manner as in the infrared ray ablation layer laminate 1 except that the carbon black dispersion obtained above was used.

<Production Example of Infrared Ray Ablation Layer Laminate 14>

41 parts of toluene were charged into a heated sealed container with a stirrer, and then 3.0 parts of modified polyolefin HARDLEN 13-LP (manufactured by TOYOBO CO., LTD.) were added with stirring, and the mixture was stirred and dissolved under the condition of 40° C. (first stage). After cooling to room temperature, 6 parts of MCF-88, which is carbon black manufactured by Mitsubishi Chemical Corporation, were added as an infrared absorbing substance, and after premixing for 90 minutes, the carbon black was dispersed using a sand mill (second stage). After that, the mixture was heated to 40° C. again, and 38.8 parts of toluene, 3 parts of methyl ethyl ketone, and 8.2 parts of HARDLEN 13-LP were added and dissolved with stirring (third step) to prepare a coating solution for the infrared ray ablation layer having a mass ratio of carbon black:resin=35: 65.

An infrared ray ablation layer laminate 14 was obtained in the same manner as in the infrared ray ablation layer laminate 1 except that the carbon black dispersion obtained above was used.

<Production Example of Infrared Ray Ablation Layer Laminate 15>

7.8 parts by mass of SEPTON 2005 (manufactured by Kuraray Co., Ltd., styrene: 20 wt %, propylene structure ($R_1$ is a methyl group, $R_2$ to $R_4$ are a hydrogen atom): 40 wt %), 70.4 parts by mass of toluene, and 17.6 parts by mass of propylene glycol 1-monomethyl ether 2-acetate (PMA) were mixed, and SEPTON 2005 was dissolved in a solvent. Thereafter, carbon black (manufactured by Mitsubishi Chemical Corporation, MCF-88) was further charged, then the mixture was mixed for 4 hours using a bead mill to obtain a carbon black dispersion.

An infrared ray ablation layer laminate 15 was obtained in the same manner as in the infrared ray ablation layer laminate 1 except that the carbon black dispersion obtained above was used.

TABLE 2

|  | Resin | Carbon black | Resin/carbon black mass ratio |
|---|---|---|---|
| Infrared ray ablation layer laminate 1 | Resin 1 | #1000 | 65/35 |
| Infrared ray ablation layer laminate 2 | Resin 2 | #1000 | 65/35 |
| Infrared ray ablation layer laminate 3 | Resin 3 | #1000 | 65/35 |
| Infrared ray ablation layer laminate 4 | Resin 4 | #1000 | 65/35 |
| Infrared ray ablation layer laminate 5 | Resin 5 | #1000 | 65/35 |
| Infrared ray ablation layer laminate 6 | Resin 6 | #1000 | 65/35 |
| Infrared ray ablation layer laminate 7 | Resin 7 | #1000 | 65/35 |
| Infrared ray ablation layer laminate 8 | Resin 8 | #1000 | 65/35 |
| Infrared ray ablation layer laminate 9 | Resin 9 | #1000 | 65/35 |
| Infrared ray ablation layer laminate 10 | Resin 10 | #1000 | 65/35 |
| Infrared ray ablation layer laminate 11 | TUFPRENE 315 | MCF-88 | 65/35 |
| Infrared ray ablation layer laminate 12 | MACROMELT 6900 | MCF-88 | 65/35 |
| Infrared ray ablation layer laminate 13 | Polyvinyl acetate/water-soluble polyamide | #1000 | 80/20 |
| Infrared ray ablation layer laminate 14 | HARDLEN 13-LP | MCF-88 | 65/35 |
| Infrared ray ablation layer laminate 15 | SEPTON 2005 | MCF-88 | 65/35 |

((4) Preparation of Photosensitive Resin Structure for Flexographic Printing Plate)

Example 1

The release film was peeled from the laminate of the support and the photosensitive resin composition layer, and the infrared ray ablation layer laminate 1 was laminated in an environment with a temperature of 25° C. and a humidity of 40% so that the infrared ray ablation layer was in contact with the photosensitive resin composition layer. The laminate was further disposed on a hot plate set to 120° C. so that the cover film side was in contact with the heating portion of the hot plate, then heat was added thereto for 1 minute to obtain photosensitive resin structure 1 for a flexographic printing plate of Example 1.

The photosensitive resin structure 1 for a flexographic printing plate of Example 1 prepared as described above was evaluated as follows. The evaluation results are shown in Table 3 below. The evaluation was performed by cutting the photosensitive resin structure for a flexographic printing plate into a size of 10 cm×15 cm, and peeling the cover film.

(Evaluation Method)

<Evaluation of Laser Sensitivity>

The photosensitive resin structure for a flexographic printing plate was placed in Esko CDI SPARK2530, and laser drawing was performed with a test image having an image pattern that formed 2 pixels in total of 2×1 pixels at a resolution of 8000 dpi and laser intensity of 3.0 J.

Thereafter, the ablated portion was observed with a laser microscope (VK-X100, manufactured by Keyence Corporation.; 100× magnification objective lens), and the length of the infrared ray ablation layer surface in the longitudinal direction (2 pixel side) ablated with the laser and the length of the interface with the photosensitive resin composition layer were measured. The length of the interface with the photosensitive resin composition layer/the length of the infrared ray ablation layer surface was evaluated as an index of laser sensitivity as follows.

(Evaluation Criteria)
- A: The hole is pierced, and the interface length of the with the photosensitive resin composition layer/the length of the infrared ray ablation layer surface is 0.50 or more
- B: The hole is pierced, and the interface length of the with the photosensitive resin composition layer/the length of the infrared ray ablation layer surface is 0.40 or more and less than 0.50
- C: The hole is pierced, and the interface length of the with the photosensitive resin composition layer/the length of the infrared ray ablation layer surface is 0.30 or more and less than 0.40
- D: The hole is pierced, and the interface length of the with the photosensitive resin composition layer/the length of the infrared ray ablation layer surface is less than 0.30
- E: The hole is not pierced <Evaluation of Flexibility>

The photosensitive resin structure for a flexographic printing plate was bent at 180° starting near the center so that the support faced inward (to the extent that the portions of the support were in contact with each other). Thereafter, whether wrinkles occurred on the infrared ray ablation layer surface was observed, and evaluated as described below.

(Evaluation Criteria)
- A: No wrinkle occurs.
- B: Wrinkles occur, but only very slightly at the end of the structure.
- C: A plurality of wrinkles occur at the end of the structure.
- D: Wrinkles occur not only at the end but also near the center of the structure.
- E: Wrinkles occur on the whole surface of the structure.

<Pinhole Evaluation>

The infrared ray ablation layer laminate 1 was laminated at a temperature of 180° C. so that the infrared ray ablation layer was in contact with the photosensitive resin composition layer to obtain a sample. After the cover film of the infrared ray ablation layer was removed, this sample was placed on a light table, and a microscopic examination was performed. In the infrared ray ablation layer, the number of pinholes having a major axis of 20 μm or more in size was counted, and the average value thereof as well as the value of (pinholes/m 2) was calculated, then evaluation was made as follows.

(Evaluation Criteria)
- A: The number of pinholes is less than 2 (pinholes/m 2) on average.
- B: The number of pinholes is 2 (pinholes/m 2) or more and less than 5 (pinholes/m 2) on average.
- C: The number of pinholes is 5 (pinholes/m 2) or more and less than 10 (pinholes/m 2) on average.
- D: The number of pinholes is 10 (pinholes/m 2) or more and less than 20 (pinholes/m 2) on average.
- E: The number of pinholes is 20 (pinholes/m 2) or more on average.

Examples 2 to 10 and Comparative Examples 1 to 5

Photosensitive resin structures 2 to 15 for flexographic printing plates of Examples 2 to 15 were prepared and evaluated in the same manner as in Example 1 except that the types of their infrared ray ablation layer laminates were changed to the infrared ray ablation layer laminates 2 to 12, respectively. The evaluation results are shown in Table 3 below.

TABLE 3

|  | Photosensitive resin structure for flexographic printing | Infrared ray ablation layer laminate | Laser sensitivity | Flexibility | Pinhole resistance evaluation |
|---|---|---|---|---|---|
| Example 1 | 1 | 1 | A(0.52) | A | A |
| Example 2 | 2 | 2 | B(0.48) | B | A |
| Example 3 | 3 | 3 | B(0.45) | C | A |
| Example 4 | 4 | 4 | A(0.53) | A | B |
| Example 5 | 5 | 5 | A(0.57) | A | B |
| Example 6 | 6 | 6 | A(0.54) | A | A |
| Example 7 | 7 | 7 | C(0.36) | A | A |
| Example 8 | 8 | 8 | C(0.32) | A | A |
| Example 9 | 9 | 9 | A(0.54) | A | C |
| Comparative Example 1 | 11 | 11 | E | A | D |
| Comparative Example 2 | 12 | 12 | E | A | E |
| Comparative Example 3 | 13 | 13 | E | A | E |
| Comparative Example 4 | 14 | 14 | E | B | B |
| Comparative Example 5 | 15 | 15 | E | A | B |
| Comparative Example 6 | 10 | 10 | A(0.57) | D | C |

((101-1) Synthesis of Hydrophilic Copolymer)

To a pressure-resistant reaction vessel with a stirrer and a temperature-regulating jacket, 125 parts by mass of water and 2 parts by mass of an ammonium salt of (α-sulfo(1-nonylphenoxy)methyl-2-(2-propenyloxy)ethoxy-poly(oxy-1,2-ethanediyl) ("Adekaria Soap" manufactured by Asahi Denka Kogyo K.K.) as a reactive emulsifier were initially charged. The internal temperature was raised to 80° C., and an oily mixed solution of a monomer mixture consisting of 10 parts by mass of styrene, 60 parts by mass of butadiene, 23 parts by mass of butyl acrylate, 5 parts by mass of methacrylic acid, and 2 parts by mass of acrylic acid, and 2 parts by mass of t-dodecylmercaptan, and an aqueous solution consisting of 28 parts by mass of water, 1.2 parts by mass of sodium peroxodisulfate, 0.2 parts by mass of sodium hydroxide, and 2 parts by mass of ammonium salt of (α-sulfo(1-nonylphenoxy)methyl-2-(2-propenyloxy)ethoxy-poly(oxy-1,2-ethanediyl) were added at a constant flow rate for 5 hours for the oily mixed solution and for 6 hours for the aqueous solution. Then, the temperature was kept at 80° C. for 1 hour to complete the polymerization reaction, and the copolymer latex was obtained and then cooled.

Furthermore, pH of the generated copolymer latex was adjusted to 7 with sodium hydroxide, and then the unreacted monomer was removed by steam stripping method, and filtered through a wire netting of 200 mesh. Finally, the solid content concentration of the filtrate was adjusted to 40% by mass to obtain a water dispersion of the hydrophilic copolymer.

The water dispersion of the obtained hydrophilic copolymer was dried up with a vacuum dryer at 50° C. to remove water to obtain a hydrophilic copolymer.

((101-2) Preparation of Base Film (Support))

As a solution for an adhesive layer to be coated with a support (base film), 55 parts by mass of TUFPRENE 912 (manufactured by Asahi Kasei Corporation, trade name) that is a block copolymer of styrene and 1,3-butadiene, 38 parts by mass of paraffin oil (average carbon number: 33, average molecular weight: 470, density at 15° C.: 2.5 parts by mass of 1,9-nonanediol diacrylate, 1.5 parts by mass of 2,2-dimethoxy-phenylacetophenone, 3 parts by mass of epoxy ester 3000M (manufactured by KYOEISHA CHEMICAL Co., LTD., trade name), and 1.5 parts by mass of VALIFAST YELLOW 3150 (manufactured by ORIENT CHEMICAL INDUSTRIES CO., LTD, trade name) were dissolved in toluene to obtain a solution having a solid content of 25%.

The solution was then applied with a knife coater to one side of a 100 μm thick polyester film so that the ultraviolet transmittance (UV transmittance) was 10%, dried at 80° C. for 1 minute to obtain a support (base film) having an adhesive layer.

The UV transmittance of the support was obtained by using a UV exposure machine AFP-1500 (manufactured by Asahi Kasei Corporation, trade name), and measuring the transmission intensity with a UV illuminometer MO-2 type machine (manufactured by ORC MANUFACTURING CO., LTD., trade name, UV-35 filter) and calculating.

((101-3) Production of Laminate of Support and

Photosensitive Resin Composition Layer) 32 parts by mass of the hydrophilic copolymer prepared in (101-1) above and 28 parts by mass of a styrene-butadiene-styrene copolymer [D-KX405: manufactured by Kraton Corporation] were mixed at 140° C. using a pressure kneader. Then, a liquid mixture of 32 parts by mass of liquid polybutadiene [LBR-352: manufactured by Kuraray Co., Ltd.], 8 parts by mass of 1,9-nonanediol diacrylate, 5 parts by mass of 1,6-hexanediol dimethacrylate, 2 parts by mass of 2,2-dimethoxyphenylacetophenone, 1 part by mass of 2,6-di-t-butyl-p-cresol, and 1 part by mass of a carbinol-modified silicone oil [KF-6000: manufactured by Shin-Etsu Chemical Co., Ltd.] were added little by little for 15 minutes. After completion of the addition, the mixture was further kneaded for another 20 minutes to obtain a photosensitive resin composition.

Next, the photosensitive resin composition was added to an extruder. Then, to one side of the photosensitive resin composition layer extruded from a T-die was laminated the adhesive layer-forming surface of the support, and to the side opposite to the support-laminated side of the photosensitive resin composition layer was laminated a release film (manufactured by Mitsubishi Chemical Corporation, DIAFOIL MRV100), to thereby obtain a laminate of the support and the photosensitive resin composition layer.

((102) Production of Resin Used in Infrared Ray Ablation Layer)

<Production of Resin 101>

After nitrogen replacement in a polymerization vessel of 2 L separable flask, 456.1 mL of n-hexane (dried with molecular sieves) and 656.5 mL of butyl chloride (dried with molecular sieves) were added using a syringe, and the polymerization vessel was cooled in a dry ice/methanol bath at −70° C. Then, a liquid feed tube made of Teflon (registered trademark) was connected to a pressure-resistant glass liquefaction sampling tube with a three-way cock, which contained 161.1 g (2871 mmol) of isobutylene monomer, and the isobutylene monomer was fed into the polymerization vessel by nitrogen pressure. 0.647 g (2.8 mmol) of p-dicumyl chloride and 1.22 g (14 mmol) of N,N-dimethylacetamide were added. 8.67 mL (79.1 mmol) of titanium tetrachloride was then added to start polymerization. After stirring at the same temperature for 1.5 hours from the start of polymerization, about 1 mL of the polymerization solution was extracted from the polymerization solution for sampling. Then, a mixed solution of 77.9 g (748 mmol) of styrene monomer, 23.9 mL of n-hexane and 34.3 mL of butyl chloride, which had been cooled to −70° C. in advance, was added to the polymerized container. 45 minutes after the addition of the mixed solution, about 40 mL of methanol was added to complete the reaction.

The solvent and the like were distilled from the reaction solution, and then the reaction solution was dissolved in toluene, and washed with water twice. Further, the toluene solution was added to a large amount of methanol to precipitate the polymer, and the obtained polymer was dried under vacuum at 60° C. for 24 hours to obtain resin 101. The content ratio of styrene was determined by $^1$H-NMR and found to be 30% by mass.

<Production Examples of Resins 102 to 105>

Resins 102 to 105 were obtained in the same manner as in resin 101 except that the type and mixing ratio of the monomers used were changed as shown in Table 4 below. The materials constituting the resin and the physical properties thereof are shown in Table 4 below.

TABLE 4

| | Constituent unit C1 | | | | | Constituent unit C2 | |
|---|---|---|---|---|---|---|---|
| Type | | Content (wt %) | R1 | R2 | R3 | R4 | Type | Content (wt %) |
| Resin 101 | Isobutylene | 70 | —CH3 | —CH3 | —H | —H | Styrene | 30 |
| Resin 102 | Isobutylene | 40 | —CH3 | —CH3 | —H | —H | Styrene | 60 |
| Resin 103 | Isobutylene | 50 | —CH3 | —CH3 | —H | —H | Styrene | 50 |
| Resin 104 | Isobutylene | 85 | —CH3 | —CH3 | —H | —H | Styrene | 15 |
| Resin 105 | Isobutylene | 85 | —CH3 | —CH3 | —H | —H | — | 0 |
| | α-Methylstyrene | 15 | —CH3 | —C6H5 | —H | —H | | |

((103) Production of Infrared Ray Ablation Layer Laminate)

<Production Example of Infrared Ray Ablation Layer Laminate 101>

6.5 parts by mass of resin 1, 54.0 parts by mass of toluene, and 36.0 parts by mass of cyclohexanone were mixed to dissolve resin 1 in the solvent. Subsequently, 3.5 parts by mass of carbon black (manufactured by Mitsubishi Chemical Corporation, #1000, pH=3.5) and 1.2 parts by mass of Solsperse 39000 (manufactured by Lubrizol Japan Limited, SP value: 11.5) were further added, then the mixture was mixed for 4 hours using a bead mill to obtain a carbon black dispersion.

A 100 μm thick PET film serving as a cover film was coated with the carbon black dispersion obtained above so that the film thickness after drying was 3.0 μm. A drying treatment at 90° C. for 2 minutes was performed to obtain infrared ray ablation layer laminate 101 which was a laminate of the infrared ray ablation layer and the cover film.

<Production Examples of Infrared Ray Ablation Layer Laminates 102 to 107, 109 to 119, and 129>

Infrared ray ablation layer laminates 102 to 107, 109 to 119, and 129 were obtained in the same manner as in the infrared ray ablation layer laminate 101 except that the resin used was changed as shown in Table 5 below.

Regarding the carbon black used, the pH of MA77 (manufactured by Mitsubishi Chemical Corporation) was 2.5, the pH of TOKABLACK #8300 (manufactured by TOKAI CARBON CO., LTD.) was 5.0, and the pH of TOKABLACK #5500 (manufactured by TOKAI CARBON CO., LTD.) was 6.0. These pHs were determined by preparing a mixed solution of carbon black and distilled water, and measuring the pH with a glass electrode pH meter in accordance with ASTM D1512 (the same applies hereinafter).

Regarding the dispersant used, the SP value of the DISPARLON DA-703-50 (manufactured by Kusumoto Chemicals, Ltd.) was 11.0, the SP value of the Solsperse 511200 (manufactured by Lubrizol Japan Limited) was 9.5, the SP value of the Solsperse 518000 (manufactured by Lubrizol Japan Limited) was 8.1, and the SP value of the AJISPER PB881 (manufactured by Ajinomoto Fine-Techno Co., Inc.) was 12.1. These SP values were obtained by the cloud point titration method (the same applies hereinafter).

<Production Example of Infrared Ray Ablation Layer Laminate 108>

41 parts of toluene were charged into a heated and sealed container with a stirring device, and 3.0 parts of chlorinated propylene SUPERCHLON HP-205 (manufactured by NIPPON PAPER INDUSTRIES CO., LTD., 68% chlorination) were added while stirring, and the mixture was stirred and dissolved under the condition of 40° C. (first stage). After cooling to room temperature, 6 parts of carbon black #1000 (manufactured by Mitsubishi Chemical Corporation) as an infrared ray absorbing substance and 1.1 parts of a dispersant 539000 were added, and after pre-mixing the mixture for 90 minutes, the carbon black was dispersed using a sand mill (second stage). The mixture was then heated again to 40° C., and 38.8 parts of toluene, 3 parts of methyl ethyl ketone, and 8.2 parts of SUPERCHLON HP-205 were added, and the mixture was stirred and dissolved (third stage) to prepare a coating solution of an infrared ray ablation layer having a mass ratio of carbon black:resin=35:65.

An infrared ray ablation layer laminate 108 was obtained in the same manner as in the infrared ray ablation layer laminate 101 except that the carbon black dispersion obtained above was used.

<Production Example of Infrared Ray Ablation Layer Laminate 120>

An infrared ray ablation layer laminate 120 was obtained in the same manner as in the infrared ray ablation layer laminate 8 except that the carbon black used was changed to Printex35 (manufactured by Degussa-Huels AG, pH=9.5).

<Production Example of Infrared Ray Ablation Layer Laminate 121>

7.8 parts by mass of hydrogenated styrene-butadiene-styrene copolymer elastomer (manufactured by Asahi Kasei Corporation, Tuftec H1051), 70.4 parts by mass of toluene, and 17.6 parts by mass of propylene glycol 1-monomethyl ether 2-acetate (PMA) were mixed and the resin was dissolved. Subsequently, 4.2 parts by mass of carbon black (manufactured by Mitsubishi Chemical Corporation, #30, pH=8.0) and 0.6 parts by mass of Solsperse 39000 (manufactured by Lubrizol Japan Limited) were further added, then the mixture was mixed for 4 hours using a bead mill to obtain a carbon black dispersion.

An infrared ray ablation layer laminate 121 was obtained in the same manner as in the infrared ray ablation layer laminate 1 except that the obtained carbon black dispersion was used.

<Production Example of Infrared Ray Ablation Layer Laminate 122>

An infrared ray ablation layer laminate 122 was obtained in the same manner as in the infrared ray ablation layer laminate 121 except that the carbon black used was changed to #1000 (manufactured by Mitsubishi Chemical Corporation, pH=3.5).

<Production Example of Infrared Ray Ablation Layer Laminate 123>

7.8 parts by mass of polyamide (manufactured by Henkel AG & Co. KGaA, MACROMELT 6900), 44.0 parts by mass of toluene, and 44.0 parts by mass of 2-propanol were mixed to dissolve the resin. Subsequently, 4.2 parts by mass of carbon black (manufactured by Mitsubishi Chemical Corporation, #30, pH=8.0) and 0.6 parts by mass of Solsperse 39000 (manufactured by Lubrizol Japan Limited) were further added, then the mixture was mixed for 4 hours using a bead mill to obtain a carbon black dispersion.

An infrared ray ablation layer laminate 123 was obtained in the same manner as in the infrared ray ablation layer laminate 101 except that the obtained carbon black dispersion was used.

<Production Example of Infrared Ray Ablation Layer Laminate 124>

An infrared ray ablation layer laminate 124 was obtained in the same manner as in the infrared ray ablation layer laminate 123 except that the carbon black used was changed to #1000.

<Production Example of Infrared Ray Ablation Layer Laminate 125>

10 parts by mass of GOHSENOL KL-05 (polyvinyl acetate having a degree of saponification of 78 to 82% by mol, manufactured by Nippon Synthetic Chemical Industry Co., Ltd.), 10 parts by mass of E-caprolactam, 90 parts by mass of a nylon salt of N-(2-aminoethyl)piperazine and adipic acid, and 100 parts by mass of water were placed in a stainless autoclave. After replacing the internal air with nitrogen gas, heating was performed at 180° C. for 1 hour to prepare a water-soluble polyamide. Subsequently, 10 parts by mass of a water-soluble polyamide obtained by the removal of water were dissolved in 40 parts by mass of water, 20 parts by mass of methanol, 20 parts by mass of n-propanol, and 10 parts by mass of n-butanol to obtain a solution. The solution was mixed with carbon black (manufactured by Mitsubishi Chemical Corporation, MA-100, pH=3.5), which was then kneaded and dispersed using a three-roll mill to obtain a carbon black dispersion.

An infrared ray ablation layer laminate 125 was obtained in the same manner as in the infrared ray ablation layer laminate 101 except that the obtained carbon black dispersion was used.

<Production Example of Infrared Ray Ablation Layer Laminate 126>

An infrared ray ablation layer laminate 126 was obtained in the same manner as in the infrared ray ablation layer laminate 125 except that the carbon black used was changed to #30.

<Production Example of Infrared Ray Ablation Layer Laminate 127>

0.5 parts by mass of an acid-modified polymer (manufactured by TOAGOSEI CO., LTD., UC-3510), 1.3 parts by mass of hydrogenated styrene-butadiene-styrene elastomer (manufactured by Asahi Kasei Corporation, Tuftec H1051), and 44 parts by mass of toluene were mixed and the resin was dissolved. Subsequently, 4.2 parts by mass of carbon black (manufactured by Mitsubishi Chemical Corporation, #30, pH=8.0) and 0.6 parts by mass of Solsperse 39000 (manufactured by Lubrizol Japan Limited) were further added, then the mixture was mixed for 4 hours using a bead mill to obtain a carbon black dispersion.

An infrared ray ablation layer laminate 127 was obtained in the same manner as in the infrared ray ablation layer laminate 101 except that the obtained carbon black dispersion was used. The materials constituting these laminates are shown in Table 5 below.

<Production Example of Infrared Ray Ablation Layer Laminate 128>

An infrared ray ablation layer laminate 128 was obtained in the same manner as in the infrared ray ablation layer laminate 127 except that the carbon black used was changed to #1000.

TABLE 5

| Infrared ray ablation layer laminate | Resin Type | Constituent unit C1 (% by mass) | Carbon black Type | pH | Dispersant Type | SP value | Resin/carbon black mass ratio |
|---|---|---|---|---|---|---|---|
| 101 | Resin 1 | 70 | #1000 | 3.5 | Solsperse S39000 | 11.5 | 65/35 |
| 102 | Resin 1 | 70 | MA77 | 2.5 | Solsperse S39000 | 11.5 | 65/35 |
| 103 | Resin 1 | 70 | TOKABLACK #8300 | 5.0 | Solsperse S39000 | 11.5 | 65/35 |
| 104 | Resin 2 | 40 | #1000 | 3.5 | Solsperse S39000 | 11.5 | 65/35 |
| 105 | Resin 3 | 50 | #1000 | 3.5 | Solsperse S39000 | 11.5 | 65/35 |
| 106 | Resin 4 | 85 | #1000 | 3.5 | Solsperse S39000 | 11.5 | 65/35 |
| 107 | Resin 5 | 100 | #1000 | 3.5 | Solsperse S39000 | 11.5 | 65/35 |
| 108 | Chlorinated propylene | 67 | #1000 | 3.5 | Solsperse S39000 | 11.5 | 65/35 |
| 109 | Resin 1 | 70 | #1000 | 3.5 | DISPARLON DA-703-50 (manufactured by Kusumoto Chemicals, Ltd.) | 11.0 | 65/35 |
| 110 | Resin 1 | 70 | #1000 | 3.5 | Solsperse S11200 | 9.5 | 65/35 |
| 111 | Resin 1 | 70 | #1000 | 3.5 | Solsperse S18000 | 8.1 | 65/35 |
| 112 | Resin 1 | 70 | #1000 | 3.5 | AJISPER PB881 (manufactured by Ajinomoto Fine-Techno Co., Inc.) | 12.1 | 65/35 |
| 113 | Resin 1 | 70 | #1000 | 3.5 | — | — | 65/35 |
| 114 | Resin 1 | 70 | #1000 | 3.5 | Solsperse S39000 | 11.5 | 85/15 |

TABLE 5-continued

| Infrared ray ablation layer laminate | Resin | | Dispersant | | Resin/carbon black mass ratio |
|---|---|---|---|---|---|
| | Constituent unit C1 | Carbon black | | | |
| | Type | (% by mass) | Type | pH | Type | SP value | |

| Infrared ray ablation layer laminate | Type | (% by mass) | Type | pH | Type | SP value | Resin/carbon black mass ratio |
|---|---|---|---|---|---|---|---|
| 115 | Resin 1 | 70 | #1000 | 3.5 | Solsperse S39000 | 11.5 | 80/20 |
| 116 | Resin 1 | 70 | #1000 | 3.5 | Solsperse S39000 | 11.5 | 75/25 |
| 117 | Resin 1 | 70 | #1000 | 3.5 | Solsperse S39000 | 11.5 | 45/55 |
| 118 | Resin 1 | 70 | #1000 | 3.5 | Solsperse S39000 | 11.5 | 50/50 |
| 119 | Resin 1 | 70 | #1000 | 3.5 | Solsperse S39000 | 11.5 | 55/45 |
| 120 | Chlorinated propylene | 67 | Printex35 | 9.5 | Solsperse S39000 | 11.5 | 65/35 |
| 121 | H1051 | 0 | #30 | 8.0 | Solsperse S39000 | 11.5 | 65/35 |
| 122 | H1051 | 0 | #1000 | 3.5 | Solsperse S39000 | 11.5 | 65/35 |
| 123 | MACROMELT 6900 | 0 | #30 | 8.0 | Solsperse S39000 | 11.5 | 65/35 |
| 124 | MACROMELT 6900 | 0 | #1000 | 3.5 | Solsperse S39000 | 11.5 | 65/35 |
| 125 | Polyvinyl acetate/water-soluble polyamide | 0 | MA100 | 3.5 | — | — | 80/20 |
| 126 | Polyvinyl acetate/water-soluble polyamide | 0 | #30 | 8.0 | — | — | 80/20 |
| 127 | H1051/UC3510 | 0 | #30 | 8.0 | Solsperse S39000 | 11.5 | 65/35 |
| 128 | H1051/UC3510 | 0 | #1000 | 3.5 | Solsperse S39000 | 11.5 | 65/35 |
| 129 | Resin 1 | 70 | TOKABLACK #5500 | 6.0 | Solsperse S39000 | 11.5 | 65/35 |

((104) Production of Photosensitive Resin Structure for Flexographic Printing Plate)

Example 101

The release film was peeled from the laminate of the support and the photosensitive resin composition layer, and the infrared ray ablation layer laminate 101 was laminated in an environment with a temperature of 25° C. and a humidity of 40% so that the infrared ray ablation layer was in contact with the photosensitive resin composition layer. The laminate was disposed on a hot plate set to 120° C. so that the cover film side was in contact with the heating portion of the hot plate, then heat was added thereto for 1 minute to obtain photosensitive resin structure 101 for a flexographic printing plate of Example 101.

The photosensitive resin structure 101 for a flexographic printing plate of Example 101 prepared as described above was evaluated as follows. The evaluation results are shown in Table 6 below. The evaluation was conducted by cutting the photosensitive resin structure for a flexographic printing plate into a size of 10 cm×15 cm, and peeling the cover film.
(Evaluation Method)
  <Evaluation of Developability for Solvent-Based Developing Solution>
The photosensitive resin structure for a flexographic printing plate was fixed by affixing the double-sided tape to a rotating drum of "AFP-1500" developing device (manufactured by Asahi Kasei Corporation, trade name) using 3-methoxybutyl acetate as the developing solution, then development was performed at a liquid temperature of 25° C., and drying was performed at 60° C. for 2 hours. The time required to develop 0.8 mm was measured.
A release film was peeled off from the laminate of the support and the photosensitive resin composition layer, and development was performed in the same manner. The developability of the infrared ray ablation layer was evaluated based on how much the development time varies due to the presence of the infrared ray ablation layer.

(Evaluation Criteria)
  A: The development time worsens by less than 30 seconds due to the presence of the infrared ray ablation layer.
  B: The development time worsens by 30 seconds or more and less than 1 minute due to the presence of the infrared ray ablation layer.
  C: The development time worsens by 1 minute or more and less than 2 minutes due to the presence of the infrared ray ablation layer.
  D: The development time worsens by 2 minutes or more and less than 3 minutes due to the presence of the infrared ray ablation layer.
  E: Washing cannot be sufficiently performed due to the presence of the infrared ray ablation layer, even when the development time has additional 3 minutes or more.
  <Evaluation of Developability for Water-Based Developing Solution>
1% aqueous solution of Nissan soap was charged to a developing device (JOW-A3-P) manufactured by Nihon Denshi Seiki Co., Ltd., and the cover film of the infrared ray ablation layer of the original printing plate obtained in (2) was peeled off, then development was performed at a liquid temperature of 40° C. Drying was performed at 60° C. for 10 minutes. The time required to develop 0.8 mm was measured.
A release film was peeled off from the laminate of the support and the photosensitive resin composition layer, and development was performed in the same manner. The developability of the infrared ray ablation layer was evaluated based on how much the development time varies due to the presence of the infrared ray ablation layer.
(Evaluation Criteria)
  A: The development time worsened by less than 1 minute even with the presence of the infrared ray ablation layer.
  B: The development time worsens by 1 minute or more and less than 2 minutes due to the presence of the infrared ray ablation layer.

C: The development time worsens by 2 minutes or more and less than 3 minutes due to the presence of the infrared ray ablation layer.

D: The development time worsens by 3 minutes or more and less than 5 minutes due to the presence of the infrared ray ablation layer.

E: Washing cannot be sufficiently performed due to the presence of the infrared ray ablation layer, even when the development time has additional 5 minutes or more.

<Evaluation of Dispersibility of Carbon Black>

A photosensitive resin structure for a flexographic printing plate was cut into an appropriate size and then resin-embedding was performed using an ultraviolet ray curable resin. A cross-section prepared by the cryomicrotome method after the resin embedding was used as an SEM observation material. Cross-section processing conditions Device used: Ultramicrotome UC6 (manufactured by Leica Microsystems GmbH)

Setting temperature: −80° C.

Setting Cut Thickness: 100 nm SEM Observation Conditions

Measuring device: Scanning electron microscope 54800 (manufactured by Hitachi, Ltd.)

Acceleration voltage: 1.0 kV

Observation magnification: 5.0 k

The infrared ray ablation layer was observed, and the obtained cross-sectional SEM observation image was evaluated as follows.

(Evaluation Criteria)

A: Carbon black is uniformly dispersed and no aggregates are observed.

B: Carbon black is uniformly dispersed, and the number of aggregates is less than 2 per field of view.

C: Carbon black is uniformly dispersed, and the number of aggregates is less than 5 per field of view.

E: Carbon black is ubiquitously present, and the number of aggregates is 5 or more per one field of view, or regions in which carbon black is not present are widespread.

Examples 102 to 119 and Comparative Examples 101 to 110

Photosensitive resin structures 102 to 129 for flexographic printing plates of Examples 102 to 119 and Comparative Examples 101 to 110 were prepared and evaluated in the same manner as in Example 101 except that the types of their infrared ray ablation layer laminates were changed to the infrared ray ablation layer laminates 102 to 129, respectively. The evaluation results are shown in Table 6 below.

TABLE 6

|  | Photosensitive resin structure for flexographic printing plate | Infrared ray ablation layer laminate | Developability for solvent-based developing solution | Developability for water-based developing solution | Dispersibility of carbon black |
| --- | --- | --- | --- | --- | --- |
| Example 1 | 101 | 101 | A | A | A |
| Example 2 | 102 | 102 | A | A | A |
| Example 3 | 103 | 103 | A | B | B |
| Example 4 | 104 | 104 | A | B | A |
| Example 5 | 105 | 105 | A | A | A |
| Example 6 | 106 | 106 | A | A | A |
| Example 7 | 107 | 107 | A | A | A |
| Example 8 | 108 | 108 | C | B | A |
| Example 9 | 109 | 109 | A | A | A |
| Example 10 | 110 | 110 | A | A | B |
| Example 11 | 111 | 111 | A | A | C |
| Example 12 | 112 | 112 | A | A | A |
| Example 13 | 113 | 113 | A | A | C |
| Example 14 | 114 | 114 | A | C | A |
| Example 15 | 115 | 115 | A | B | A |
| Example 16 | 116 | 116 | A | A | A |
| Example 17 | 117 | 117 | B | A | C |
| Example 18 | 118 | 118 | B | A | B |
| Example 19 | 119 | 119 | A | A | A |
| Comparative Example 1 | 120 | 120 | D | D | E |
| Comparative Example 2 | 121 | 121 | A | E | A |
| Comparative Example 3 | 122 | 122 | B | D | E |
| Comparative Example 4 | 123 | 123 | A | E | A |
| Comparative Example 5 | 124 | 124 | B | D | E |
| Comparative Example 6 | 125 | 125 | E | A | A |
| Comparative Example 7 | 126 | 126 | D | A | E |
| Comparative Example 8 | 127 | 127 | B | B | E |
| Comparative Example 9 | 128 | 128 | B | B | E |
| Comparative Example 10 | 129 | 129 | A | D | C |

INDUSTRIAL APPLICABILITY

The photosensitive resin structure for a flexographic printing plate according to the present invention has a wide range of industrial applicability in the general commercial printing field.

REFERENCE SIGNS LIST

1 . . . Photosensitive resin structure for flexographic printing plate, a . . . Support, b . . . Photosensitive resin composition layer, b' . . . Photosensitive resin composition layer irradiated for pattern exposure, c . . . Infrared ray ablation layer, c' . . . Infrared ray ablation layer on which a pattern is drawn and processed

The invention claimed is:

1. A photosensitive resin structure for a flexographic printing plate, comprising:
   a support (a);
   a photosensitive resin composition layer (b) laminated on the support (a); and
   an infrared ray ablation layer (c) laminated on the photosensitive resin composition layer (b),
   wherein the infrared ray ablation layer (c) comprises a resin having a constituent unit c1 represented by the following formula (1):

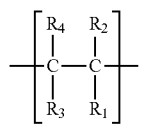

Formula (1)

wherein $R_1$ and $R_2$ each independently represent a non-polar group, and $R_3$ and $R_4$ each independently represent a hydrogen atom or a non-polar group.

2. The photosensitive resin structure for the flexographic printing plate according to claim 1, wherein
   a content of the constituent unit (c1) is 40% by mass or more and 100% by mass or less based on a total amount of the resin.

3. The photosensitive resin structure for the flexographic printing plate according to claim 1, wherein
   $R_3$ and $R_4$ of the formula (1) are each independently a hydrogen atom, an alkyl group, an aryl group, a cycloalkyl group, a phenyl group, an alkenyl group, an aralkyl group, a cycloalkenyl group, an alkynyl group, a silyl group, or a siloxanyl group.

4. The photosensitive resin structure for the flexographic printing plate according to claim 1, wherein $R_3$ and $R_4$ of the formula (1) are a hydrogen atom.

5. The photosensitive resin structure for the flexographic printing plate according to claim 1, wherein
   $R_1$ and $R_2$ of the formula (1) are each independently an alkyl group, an aryl group, a cycloalkyl group, a phenyl group, an alkenyl group, an aralkyl group, a cycloalkenyl group, an alkynyl group, a silyl group, or a siloxanyl group.

6. The photosensitive resin structure for the flexographic printing plate according to claim 1, wherein
   $R_1$ and $R_2$ of the formula (1) are each independently an alkyl group or a phenyl group.

7. The photosensitive resin structure for the flexographic printing plate according to claim 1, wherein
   $R_1$ and $R_2$ of the formula (1) are an alkyl group.

8. The photosensitive resin structure for the flexographic printing plate according to claim 1, wherein
   the resin further has a constituent unit (c2) which is different from the constituent unit (c1) and has an aromatic group in a side chain.

9. The photosensitive resin structure for the flexographic printing plate according to claim 1, wherein
   the constituent unit (c2) includes a constituent unit derived from a monovinyl-substituted aromatic hydrocarbon.

10. The photosensitive resin structure for the flexographic printing plate according to claim 1, wherein
    the infrared ray ablation layer (c) comprises carbon black, and
    pH of the carbon black is 2.0 or higher and 5.0 or lower.

11. The photosensitive resin structure for the flexographic printing plate according to claim 1, wherein
    the infrared ray ablation layer (c) comprises a dispersant, and
    a solubility parameter (SP value) of the dispersant is 9.5 or more and 12.5 or less.

12. The photosensitive resin structure for the flexographic printing plate according to claim 1, wherein
    a mixing ratio of the resin to the carbon black (resin/carbon black) in the infrared ray ablation layer (c) is in a range of 80/20 to 50/50.

13. A method for producing a flexographic printing plate, using the photosensitive resin structure for the flexographic printing plate according to claim 1, and comprising:
    first performing ultraviolet ray irradiation from a side of the support (a)
    second drawing and processing a pattern on the infrared ray ablation layer (c) by infrared ray irradiation;
    third irradiating the photosensitive resin composition layer (b) with an ultraviolet ray for pattern exposure using, as a mask, the infrared ray ablation layer (c) on which the pattern is drawn and processed; and
    fourth removing the infrared ray ablation layer (c) and an unexposed portion of the photosensitive resin composition layer (b).

14. A flexographic printing method using the photosensitive resin structure for the flexographic printing plate according to claim 1, and comprising:
    first performing ultraviolet ray irradiation from a side of the support (a);
    second drawing and processing a pattern on the infrared ray ablation layer (c) by infrared ray irradiation;
    third irradiating the photosensitive resin composition layer (b) with an ultraviolet ray for pattern exposure using, as a mask, the infrared ray ablation layer (c) on which the pattern is drawn and processed;
    fourth removing the infrared ray ablation layer (c) and an unexposed portion of the photosensitive resin composition layer (b) to produce a flexographic printing plate; and
    fifth performing printing using the flexographic printing plate.

* * * * *

UNITED STATES PATENT AND TRADEMARK OFFICE
CERTIFICATE OF CORRECTION

PATENT NO. : 12,019,374 B2
APPLICATION NO. : 18/037437
DATED : June 25, 2024
INVENTOR(S) : H. Akiyama et al.

It is certified that error appears in the above-identified patent and that said Letters Patent is hereby corrected as shown below:

In the Claims

Column 42, Line 36 (Claim 13, Line 5), please change "(a)" to -- (a); --

Signed and Sealed this
Twenty-ninth Day of October, 2024

*Katherine Kelly Vidal*
Katherine Kelly Vidal
*Director of the United States Patent and Trademark Office*